(12) United States Patent
Frisch et al.

(10) Patent No.: US 7,627,790 B2
(45) Date of Patent: Dec. 1, 2009

(54) APPARATUS FOR JITTER TESTING AN IC

(75) Inventors: Arnold M. Frisch, Portland, OR (US); Thomas Arthur Almy, Tualatin, OR (US)

(73) Assignee: Credence Systems Corporation, Milpitas, CA (US)

( * ) Notice: Subject to any disclaimer, the term of this patent is extended or adjusted under 35 U.S.C. 154(b) by 793 days.

(21) Appl. No.: 10/992,955

(22) Filed: Nov. 18, 2004

(65) Prior Publication Data

US 2005/0097420 A1    May 5, 2005

Related U.S. Application Data

(63) Continuation-in-part of application No. 10/646,957, filed on Aug. 21, 2003, now Pat. No. 7,171,601, which is a continuation-in-part of application No. 10/954,572, filed on Sep. 30, 2004.

(51) Int. Cl.
| | |
|---|---|
| G06K 5/04 | (2006.01) |
| H04B 3/46 | (2006.01) |
| H04B 17/00 | (2006.01) |
| H04Q 1/20 | (2006.01) |
| H04L 7/00 | (2006.01) |
| H04L 25/00 | (2006.01) |
| H04L 25/40 | (2006.01) |
| G01R 31/28 | (2006.01) |
| G06F 11/00 | (2006.01) |
| G04F 1/00 | (2006.01) |
| G04F 5/00 | (2006.01) |
| G04F 3/00 | (2006.01) |
| G04F 7/00 | (2006.01) |
| G04F 8/00 | (2006.01) |
| G04F 10/00 | (2006.01) |
| G04G 7/00 | (2006.01) |
| G04G 5/00 | (2006.01) |
| G04G 15/00 | (2006.01) |
| H03L 7/00 | (2006.01) |
| H03H 11/26 | (2006.01) |

(52) U.S. Cl. .................. 714/700; 375/371; 375/376; 375/226; 702/176; 702/177; 714/724; 714/815; 714/742; 327/161; 327/269; 327/262

(58) Field of Classification Search .................. None
See application file for complete search history.

(56) References Cited

U.S. PATENT DOCUMENTS 4,074,358 A    2/1978   Caputo et al.

(Continued)

*Primary Examiner*—Cynthia Britt
*Assistant Examiner*—Guerrier Merant

(57) ABSTRACT

An integrated circuit tester channel includes an integrated circuit (IC) for adding a programmably controlled amount of jitter to a digital test signal to produce a DUT input signal having a precisely controlled jitter pattern. The IC also measures periods between selected edges of the same or different ones of the DUT output signal, the DUT input signal, and a reference clock signal. Additionally, when the DUT input and output signals convey repetitive patterns, the IC can measure the voltage of the DUT input out output signal as selected points within the pattern by comparing it to an adjustable reference voltage. Processing circuits external to the IC program the IC to provide a specified amount of jitter to the test signal, control the measurements carried out by the measurement circuit, and process measurement data to determine the amount of jitter and other characteristics of the DUT output signal, and to calibrate the jitter in the DUT input signal.

20 Claims, 13 Drawing Sheets

U.S. PATENT DOCUMENTS

| | | | |
|---|---|---|---|
| 4,164,648 A | 8/1979 | Chu | |
| 4,425,643 A | 1/1984 | Chapman et al. | |
| 4,559,636 A | 12/1985 | Goldrian | |
| 4,654,848 A | 3/1987 | Noguchi | |
| 4,678,345 A | 7/1987 | Agoston | |
| 4,730,314 A | 3/1988 | Noguchi | |
| 4,792,932 A | 12/1988 | Bowhers et al. | |
| 4,924,468 A | 5/1990 | Horak et al. | |
| 4,979,177 A | 12/1990 | Jackson | |
| 5,122,978 A * | 6/1992 | Merrill | 702/79 |
| 5,144,525 A | 9/1992 | Saxe et al. | |
| 5,214,784 A | 5/1993 | Ward et al. | |
| 5,282,213 A | 1/1994 | Leigh et al. | |
| 5,369,640 A * | 11/1994 | Watson et al. | 714/700 |
| 5,557,196 A | 9/1996 | Ujiie | |
| 5,652,668 A | 7/1997 | Aulet et al. | |
| 5,793,822 A * | 8/1998 | Anderson et al. | 375/371 |
| 5,796,745 A | 8/1998 | Adams et al. | |
| 5,815,512 A | 9/1998 | Osawa et al. | |
| 5,822,228 A * | 10/1998 | Irrinki et al. | 714/718 |
| 5,835,501 A | 11/1998 | Dalmia et al. | |
| 5,838,177 A * | 11/1998 | Keeth | 327/108 |
| 5,854,996 A | 12/1998 | Overhage et al. | |
| 5,948,115 A | 9/1999 | Dinteman | |
| 6,006,347 A | 12/1999 | Churchill et al. | |
| 6,064,948 A | 5/2000 | West et al. | |
| 6,069,504 A * | 5/2000 | Keeth | 327/108 |
| 6,084,434 A * | 7/2000 | Keeth | 326/87 |
| 6,137,283 A | 10/2000 | Williams et al. | |
| 6,295,315 B1 | 9/2001 | Frisch et al. | |
| 6,366,631 B1 * | 4/2002 | Nakayama et al. | 375/371 |
| 6,449,741 B1 | 9/2002 | Organ et al. | |
| 6,463,560 B1 | 10/2002 | Bhawmik et al. | |
| 6,501,693 B2 | 12/2002 | Takatsuka et al. | |
| 6,510,549 B1 * | 1/2003 | Okamura | 716/17 |
| 6,535,014 B2 | 3/2003 | Chetlur et al. | |
| 6,570,592 B1 | 5/2003 | Sajdak et al. | |
| 6,574,168 B2 * | 6/2003 | Hayashi | 368/118 |
| 6,584,419 B1 | 6/2003 | Alexander | |
| 6,587,811 B2 * | 7/2003 | Schleifer et al. | 702/176 |
| 6,611,477 B1 | 8/2003 | Speyer et al. | |
| 6,622,107 B1 | 9/2003 | West | |
| 6,661,836 B1 | 12/2003 | Dalal et al. | |
| 6,789,217 B2 | 9/2004 | Slaugh et al. | |
| 6,799,128 B2 | 9/2004 | Duff et al. | |
| 6,799,144 B2 | 9/2004 | Li et al. | |
| 6,850,852 B1 | 2/2005 | Ferguson et al. | |
| 6,917,595 B2 * | 7/2005 | Chang et al. | 370/248 |
| 7,002,334 B2 * | 2/2006 | Tanaka et al. | 324/76.11 |
| 7,136,772 B2 | 11/2006 | Duchi et al. | |
| 7,171,601 B2 | 1/2007 | Frisch | |
| 7,177,611 B2 * | 2/2007 | Goldman | 455/260 |
| 7,199,370 B2 * | 4/2007 | Xie et al. | 250/363.03 |
| 7,218,670 B1 | 5/2007 | Lesea et al. | |
| 7,409,617 B2 | 8/2008 | Almy et al. | |
| 2002/0041538 A1 * | 4/2002 | Hayashi | 368/121 |
| 2003/0100265 A1 * | 5/2003 | Wang et al. | 455/67.3 |
| 2005/0036578 A1 * | 2/2005 | Heidel et al. | 375/371 |
| 2005/0111536 A1 * | 5/2005 | Cranford et al. | 375/226 |
| 2005/0160331 A1 * | 7/2005 | Wilsher | 714/700 |
| 2005/0218881 A1 * | 10/2005 | Tanaka et al. | 324/76.11 |
| 2006/0069967 A1 * | 3/2006 | Almy et al. | 714/724 |

* cited by examiner

APPARATUS FOR JITTER TESTING AN IC

CROSS-REFERENCE TO RELATED APPLICATIONS

This application is a continuation-in-part of U.S. patent application Ser. No. 10/646,957 filed Aug. 21, 2003 now U.S. Pat. No. 7,171,601.

This application is also a continuation-in-part of U.S. patent application Ser. No. 10/954,572 filed Sep. 30, 2004.

BACKGROUND OF THE INVENTION

1. Field of the Invention

The invention relates in general to an apparatus for testing an integrated circuit (IC) and in particular to an apparatus for testing the ability of an IC to accommodate jittery input signals and for measuring the amount of jitter in its output signals.

2. Description of Related Art

Digital integrated circuits (ICs) communicate through digital data signals, and when a transmitting IC transmits a digital data signal to a receiving IC, it typically synchronizes state changes in the digital data signal to leading (or trailing) edges of a periodic clock signal so that they occur at predictable times. To produce a data sequence represented by successive states of the digital signal, the receiving IC must digitize the data signal with an appropriate sampling phase and frequency. In some communication systems, a transmitter sending a digital data signal to a receiver also sends a clock signal to the receiver for controlling the timing with which the receiver samples the data signal. In other communication systems the receiver may include a clock recovery system for generating the sampling clock signal locally, using a feedback control system to adjust the phase and frequency of the sampling clock signal based on an analysis of data the receiver acquires by observing the data signal.

FIG. 1 depicts the voltage of a typical serial data signal as a function of time. The signal transitions between high and low logic levels VH and VL differ by a nominal peak-to-peak voltage VPP with transitions occurring with a nominal clock period P. While a transmitting IC may synchronize the edges of a data signal to edges of a clock signal having period P, a data signal can often appear somewhat jittery to a receiving IC because the timing with which data signal edges cross a midpoint level midway between VH and VL can vary to some extent relative to timing of clock signal edges, for example, due to noise introduced into the data signal. For example, while edges 10 and 11 cross over the midpoint level at the expected times, noise in edge 12 causes it to cross over the midpoint level too soon. Noise can also cause variation in the signal's amplitude when it is supposed to be at its high and low logic levels as shown, for example, at points 14 and 15 in the waveform of FIG. 1.

Variation in signal edge timing (jitter) can be random or deterministic. Random jitter arises from random noise in the transmitting IC or in the signal path conveying the signal to the receiving IC. In a system where the transmitting IC sends a clock signal to the receiving IC, noise in the clock signal path can also cause the receiving IC to perceive the data signal to be jittery relative to clock signal edges. In a receiving IC employing a clock recovery system to generate a local clock signal, feedback errors or noise in the clock recovery system can cause jitter in the clock signal, thereby causing the data signal to appear jittery relative to clock signal edges. Random jitter renders the timing of each data signal edge somewhat non-deterministic in that is not possible for the receiving IC to predict the amount of timing error in any individual signal edge arising from random noise.

Deterministic jitter arises mainly from inherent characteristics of the transmitting and receiving ICs and the signal path interconnecting them. For example any transmission line will delay signal edges by an amount that is a function of the path's impedance characteristics and the frequency of the signal. When a digital data signal conveys a bit pattern such as {01010101 . . . }, it will act as a relatively higher frequency signal than when it conveys a bit pattern such as {000001111100000111111 . . . }. Thus the amount by which a signal path delays an edge of a digital signal at any given moment depends on the particular data pattern the signal currently conveys. This "pattern-dependant" jitter is deterministic in that timing error in each data signal edge due to pattern-dependant jitter for a given pattern is predictable based on the nature of the pattern and on characteristics of the hardware implementing the signal path. Deterministic jitter that is not pattern-dependant can arise, for example, from periodic noise that is coherent with the clock signal the transmitting IC uses to time edges.

FIG. 2 is a conventional "eye-diagram" generated by a storage oscilloscope repeatedly sweeping a digital signal so that traces of a large number of the signal's data cycles are superimposed on the display. If the signal were not subject to noise or jitter, the signal trace would follow the path indicated by the solid lines of FIG. 2, but due to noise and jitter, the signal trace can move anywhere in the shaded area of FIG. 2.

Since a receiving IC periodically samples a digital signal between transitions to determine the data sequence it represents, it can tolerate some amount of jitter, but when a digital signal is too jittery, the receiving IC not be able to correctly determine each successive state of the digital signal from the samples it acquires because it will sometimes sample the signal to soon or too late. Digital system specifications therefore require that the amount of jitter in a digital signal remain within acceptable limits. One measure of jitter, called "peak-to-peak jitter" corresponds to the width of the shaded area of FIG. 2 at the nominal crossover point 20, representing a difference in relative timing of earliest and latest arriving signal edges. System specifications typically require peak-to-peak jitter to remain within a predetermined limit.

A receiving IC can also tolerate some amount of noise-induced variation in the voltage of its signal logic levels, but when the variation becomes too large, it will not be able to correctly determine the logic level represented by each sample because the signal may sometimes may fail to be on the correct side of the midpoint voltage at the moment the receiver samples it. Digital system specifications therefore require that the amount of voltage variation in a digital signal remain within acceptable limits. For example, some digital system specifications require that the difference between the lowest detected high logic level and the highest detected low logic level (the "vertical eye opening" shown in FIG. 2) to be no smaller than some specified minimum.

A typical IC tester includes a set of tester channels, each connected to a separate pin of an IC device under test (DUT). An IC test is typically organized into a succession of test cycles, and at any time during a test cycle, each tester channel can either send an input signal to a DUT pin or sample a DUT output signal appearing at the pin to determine whether it is of an expected state. Each tester channel includes a memory containing a sequence of data words (vectors), each corresponding to a separate test cycle and indicating what the tester channel is to do during the test cycle and when during the test cycle it is to do it. For example a vector may tell the tester channel to change the state of a DUT input signal at some time during the test cycle, or may tell the tester channel to sample a DUT output signal to determine whether it is of a particular logic level.

To test a DUT's tolerance for a jittery input signal, a channel could be programmed to produce a DUT input signal having a desired jitter pattern. However while a tester channel can accurately adjust timing of DUT input signal edges, in many applications a typical tester channel cannot control the timing of edges of a DUT input signal with sufficient resolution to produce the desired jitter pattern. What is needed is an IC tester channel that can produce a jittery test signal exhibiting a very accurately controlled jitter pattern.

SUMMARY OF THE INVENTION

The invention relates to an apparatus for determining whether DUT output signals of an integrated circuit (IC) device under test (DUT) behave as expected when one or more of the DUT's input signals exhibit a specified jitter pattern, and for measuring the amount of jitter in DUT output signals.

An IC tester channel in accordance with the invention includes an IC implementing a transmitter circuit for adding a programmably controlled amount of jitter to a digital test signal thereby to produce a DUT input signal having a precisely controlled jitter pattern. The IC also implements a measurement circuit for measuring times between selected edges of the DUT output signal, the DUT input signal and other signals, and a digitizer circuit for comparing either the DUT input or output signal voltage to an adjustable reference voltage to produce a data signal indicating the magnitude of the DUT output signal at a selected times.

Processing circuits that may be external to the IC supply the digital test signal to the IC, program the IC to provide a specified amount of jitter to the test signal, control the measurement circuit, adjust the reference voltage, and process the measurement data it produces to determine the amount of jitter and other characteristics of the DUT output signal. For calibration purposes, the processing circuits also determine the amount of jitter in the DUT input signal based on the data signal the measurement circuit produces. The processing circuit also processes the data signal produced by the receiver circuit to determine whether the DUT output signal behaves as expected.

The receiver circuit, the transmitter circuit and the measurement circuit are all implemented on the same IC in order to keep signal paths interconnecting them to one another and to the DUT short, thereby minimizing delays and noise in those signal paths. Since the communications between the IC and the processing circuit are not as sensitive to noise and delays, the processing circuit can be external to the IC.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The invention relates in general to automated test equipment, and in particular to a system for testing an integrated circuit for its tolerance to jitter in its input signals and for measuring the amount of jitter in its output signals. While the specification describes in detail an exemplary embodiment of the invention considered a best mode of practicing the invention, those of skill in the art will appreciate that other modes of practicing the invention are possible.

Figure 3:
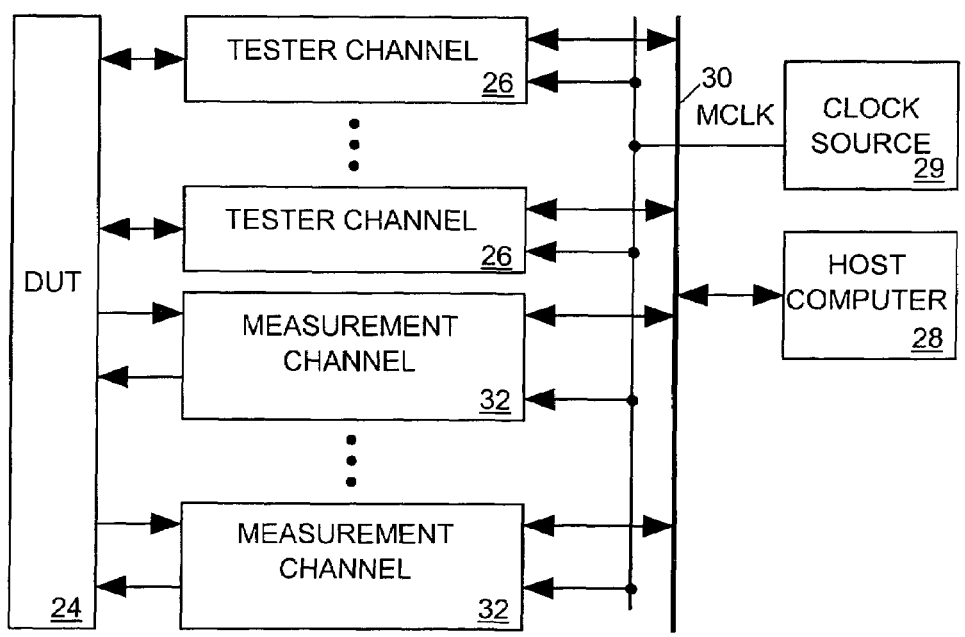
FIG. 3 depicts an integrated circuit (IC) tester incorporating a measurement system in accordance with the present invention.

FIG. 3 depicts an integrated circuit (IC) tester 22 incorporating the present invention, including a set of conventional tester channels 26, each connected to a separate pin of an IC device under test (DUT) 24 through signal paths 31. Programmed by instructions supplied from a host computer 28 via a bus 30 and synchronized to a master clock signal MCLK produced by a clock source 29, each tester channel 26 may either transmit an input signal having a particular pattern to DUT 24 or monitor an output signal produced by DUT 24 to determine whether it exhibits an expected pattern.

Tester 22 also includes one or more measurement channels 32 in accordance with the invention, each capable of performing various measurements on a digital DUT output signal enabling host computer 28 to determine, for example, the amount of random and deterministic jitter in the DUT output signal, the amount of variation in its logic levels, its period or frequency, its rise and fall times, and its skew relative to a reference signal. Each measurement channel 32 can also transmit a high speed digital input signal to DUT 24, and can add a controlled amount of jitter to the DUT input signal to test the DUT's jitter tolerance. Channels 32 are particularly suited for measuring characteristics of high frequency digital signals such as serialization/deserialization (SERDES) signals where noise and jitter can be particularly problematic.

Figure 4:
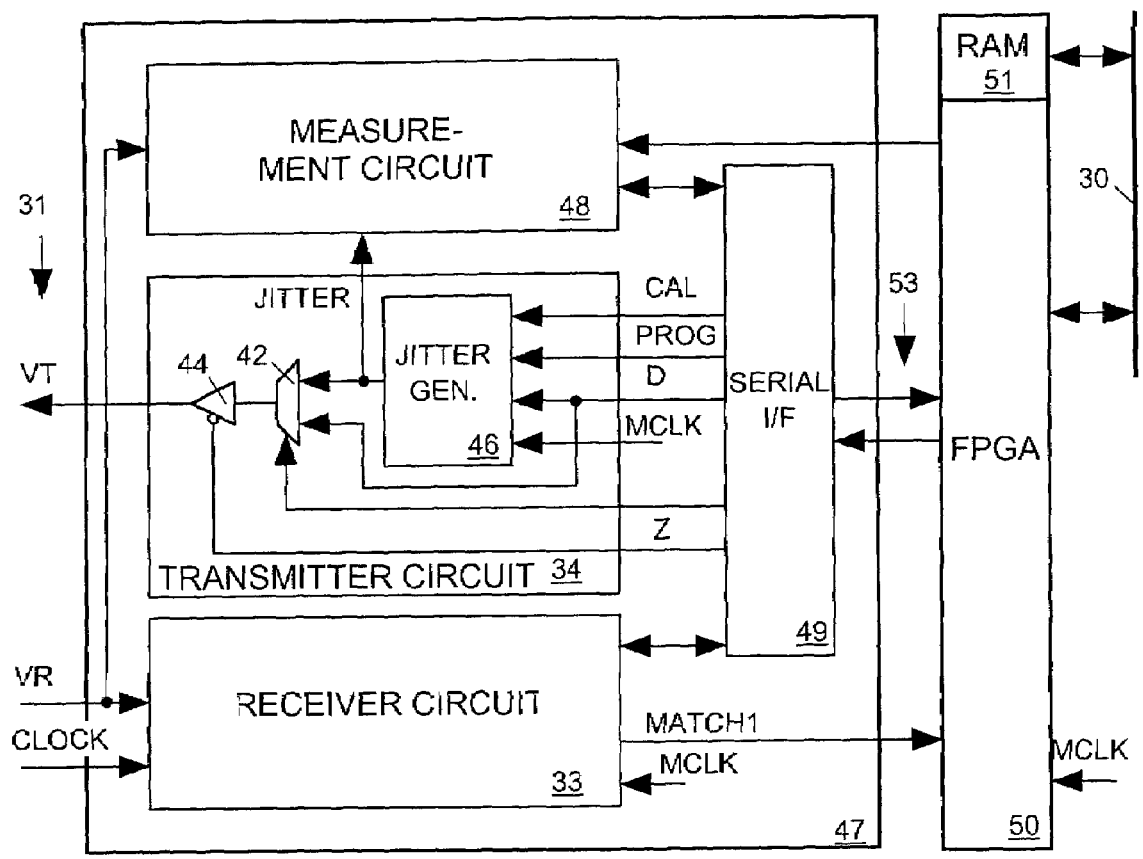
FIG. 4 depicts one of the measurement channels of the IC tester of FIG. 3 in more detailed block diagram form.

FIG. 4 depicts one of measurement channels 32 in more detailed block diagram form, including an IC 47, a field programmable gate array (FPGA) 50 and a random access memory 51. IC 47 implements a conventional receiver circuit 33, a transmitter circuit 34, a measurement circuit 48 and a serial interface circuit 49. Serial interface circuit 49 multiplexes various signals of circuits 33, 34 and 48 used to communicate with FPGA 50 into a pair of high speed serial data lines 53 linking IC 47 to FPGA 50.

IC 47 communicates with the DUT via a DUT output signal VR and a DUT input signal VT conveyed by signal paths 31. Host computer 28 can program the conventional receiver circuit 33 with programming data supplied via bus 30, FPGA 50 and serial interface 49 to receive a DUT output signal VR, to determine whether the data sequence it represents exhibits an expected bit pattern, and to report the results back to host computer 28. The nature of receiver circuit 33 depends on the nature of DUT output signal VR. When the VR signal is a high-speed serial signal such as a SERDES signal, receiver circuit 33 may include a conventional clock recovery system for deriving the receiver's sampling clock from VR and circuits for de-serializing and decoding the data sequence. Alternatively receiver circuit 33 may be clocked by a clock signal (CLOCK) supplied by the DUT or by the tester's master clock MCLK.

IC 47 also implements a transmitter circuit 34 for transmitting a DUT input signal VT to a terminal of DUT 24. During a test in which transmitter circuit 34 is to supply an input signal to DUT 24, FPGA 50 supplies a digital test signal D via serial interface circuit 49 and a multiplexer 42 to an input of a tri-state driver 44, and supplies a tri-state control signal Z to driver 44. During portions of a test in which the DUT input signal VT is to exhibit a controlled amount of jitter, bus interface circuit 39 signals multiplexer 42 to select the output of a jitter generator 46 as input to driver 44. Jitter generator 46 variably delays test signal D to add an amount of jitter to the DUT input signal VT. Before the start of a jitter test, host computer 28 of FIG. 3 writes control data into jitter generator 46 via FPGA 50 and serial interface 49 defining characteristics of the jitter to be added to test signal D to produce DUT input signal VT.

Channel 32 also includes a measurement circuit 48 capable of measuring various characteristics of DUT output signal VR and generating data describing those signal characteristics. FPGA 50 processes that data and provides an interface between Measurement circuit 48 and bus 30. Channel 32 also includes a random access memory (RAM) 51 that FPGA 50 uses for storing data. Receiver circuit 33, transmitter circuit 34 and measurement circuit 48 are implemented on the same integrated circuit 51 which includes a high speed serial interface 49 providing a data communication link between FPGA 50 and the other devices implemented within IC 51.

Measurement circuit 48 has two basic functions, digitizing and time measurement. When acting as a digitizer, measurement circuit 48 periodically samples the DUT output signal VR several times in succession and generates sample data in which each bit indicates whether a corresponding sample of the VR signal is above or below a threshold level. When performing time measurements, measurement circuit 48 measures an interval between two selected signal edges and produces data indicating the results of the interval measurement. The two signal edges may be edges of the same or differing ones of the VR, JITTER, or ARM2 signals of FIG. 5. FPGA 50 responds to commands and control data from host computer 28 of FIG. 3 by configuring measurement circuit 48 to carry out one or more digitizing or time measurement operations. As discussed in more detail below, FPGA 50 can also process the data output of measurement circuit 48 to generate results data depicting various characteristics of DUT output signal VR. Host computer 28 can then access the results data via bus 30.

Measurement Circuit

Figure 5:
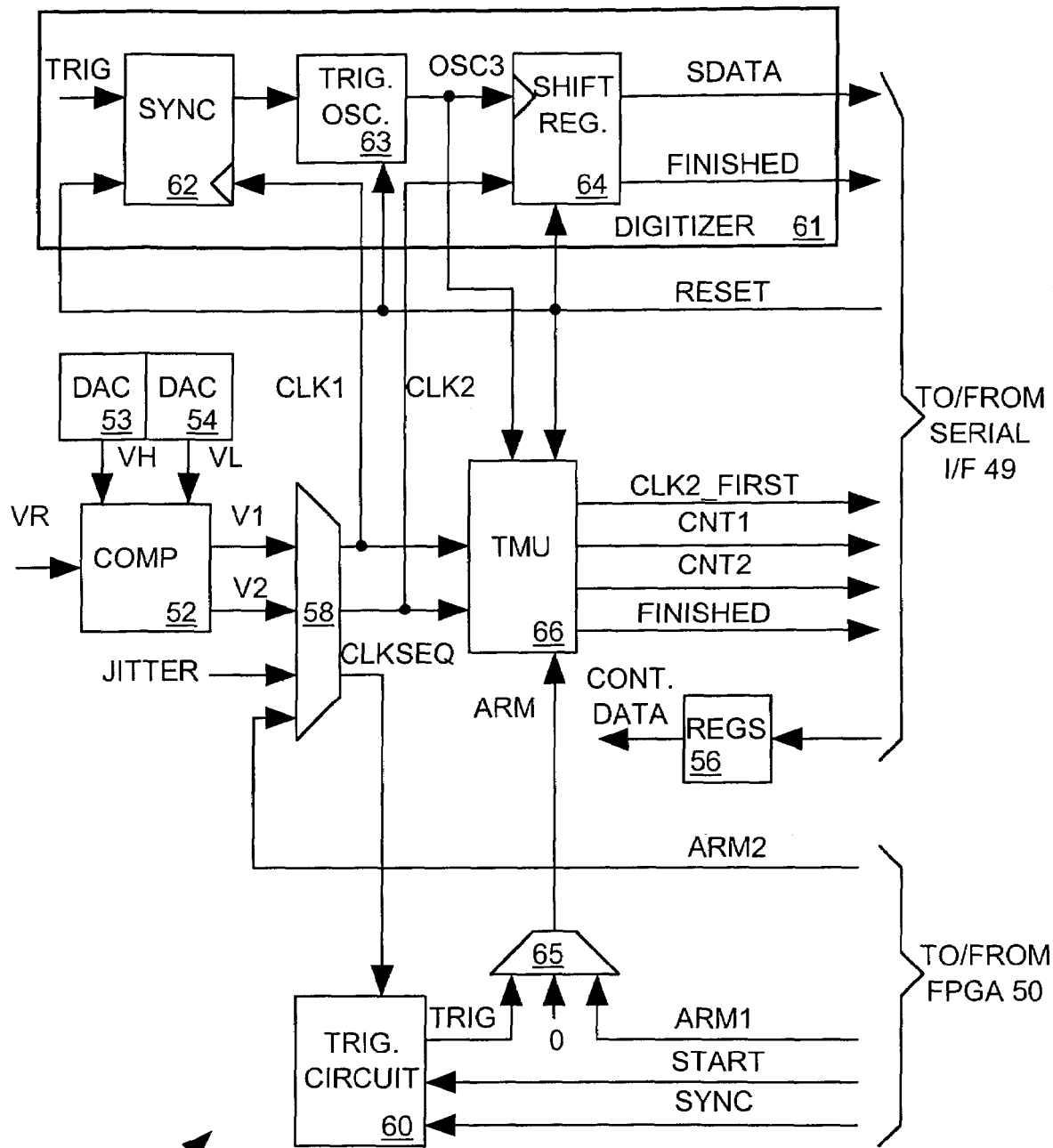
FIG. 5 depicts the measurement circuit of FIG. 4 in more detailed block diagram form.

FIG. 5 depicts measurement circuit 48 of FIG. 4 in more detailed block diagram form. Measurement circuit 48 includes a digitizer 61 for responding to an edge of a trigger signal (TRIG) by periodically sampling a signal (CLK2) at a controlled phase and frequency to produce digital output data (SDATA) representing logic states of the successive samples. Measurement circuit 48 also includes a time measurement unit (TMU) 66 for responding to an ARM signal edge by measuring a period between edges of two signals (CLK1 and CLK2) and by providing output data CNT1 and CNT2 representing the measured period.

A trigger circuit 60 generates edges of a trigger signal TRIG in response to selected edges of another signal CLK-SEQ. A multiplexer 65 may select either the TRIG signal or an ARM1 signal supplied by FPGA 50 as the source of the ARM signal input to TMU 66, or may disable TMU 66 by selecting a hard-wired 0 as the ARM signal input to TMU 66.

A multiplexer 58 selects sources of the CLK1, CLK2 and CLKSEQ signals from among a set of signals V1, V2, JITTER and ARM2. A comparator 52 drives V1 high whenever the DUT output signal VR rises above a voltage VH provided by a digital-to-analog converter (DAC) 53 and drives V2 high when VR falls below a voltage VL generated by a DAC 54. The JITTER signal is the signal appearing at the output of jitter generator 46 of FIG. 4. FPGA 50 supplies the ARM2 signal.

FPGA 50 of FIG. 4 writes control data into a set of control registers 56 via serial interface 49 for controlling multiplexers 56 and 58, for controlling the output voltages VH and VL of DACs 53 and 54, and for controlling various operating modes of trigger circuit 60 and TMU 66. Digitizer Digitizer 61 includes a synchronizing circuit 62 for responding to an edge of the TRIG signal output of trigger circuit 60 by triggering a triggered oscillator 63 on the next edge of the CLK1 signal. Control data in registers 56 controls the phase and frequency of the output OSC3 of oscillator 63. The OSC3 clocks a sampling circuit 64 which acquires a sample of the CLK2 signal on the first 12 leading edges of the OSC3 signal and stores a bit of its 12-bit output word SDATA resenting the sampled state of the CLK2 signal. Sampling circuit 64 transmits a FINISHED signal to FPGA 50 to indicate when it has acquired all 12 samples. A RESET signal from FPGA 50 resets synchronizer 62, oscillator 63 and sampling circuit 64 to enable them to acquire another set of 12 samples in response to a next TRIG signal edge.

Figure 6:
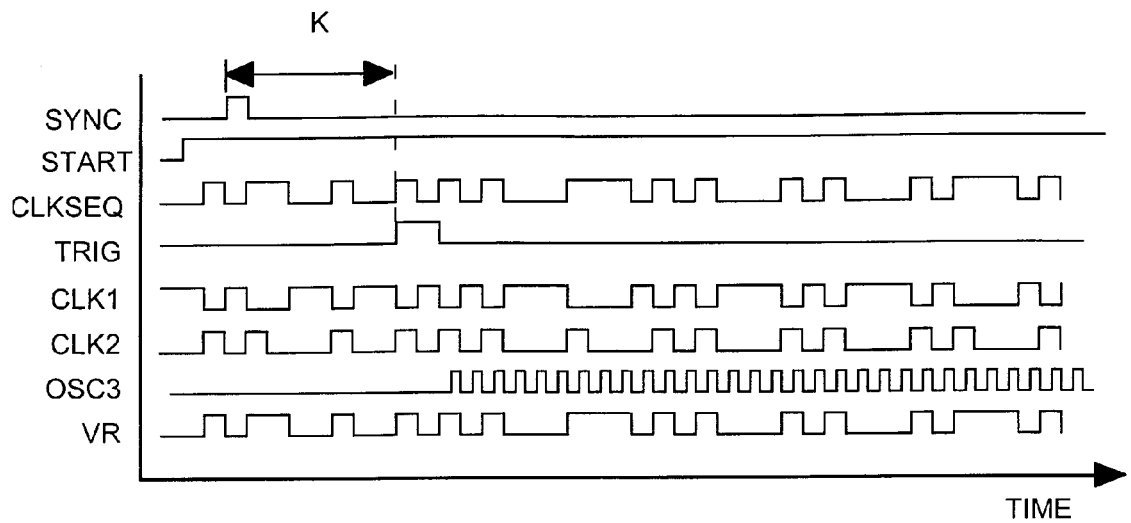
FIG. 6 is a timing diagram illustrating an example behavior of various signals of FIG. 5.

FIG. 6 is a timing diagram illustrating an example of how various signals of FIG. 5 behave when digitizer 61 is used to digitize DUT output signal VR. When armed by a START signal from FPGA,50, trigger circuit 60 monitors a synchronizing signal (SYNC) output of FPGA 50 indicating a point during a test at which a repetitive pattern appears in VR. After detecting the SYNC signal, trigger circuit 60 counts a predetermined number K of leading edges of that pattern in the CLKSEQ signal derived from VR, and then generates a pulse of the TRIG signal. Synchronizer 62 then signals oscillator 63 to begin generating the OSC3 signal with a period adjusted by data in control register 56 so that shift register 64 samples the CLK2 signal at an appropriate time during each data cycle.

Time Measurement Unit

Figure 7:
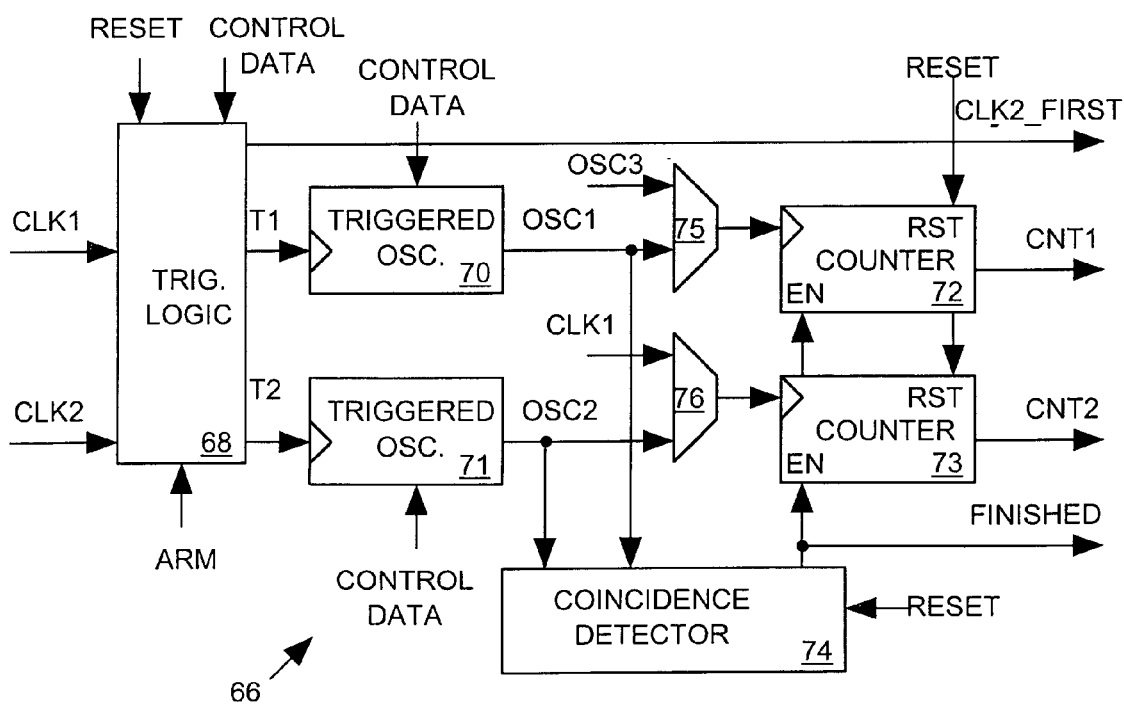
FIG. 7 illustrates the time measurement unit (TMU) of FIG. 5 in more detailed block diagram form.
Figure 8:
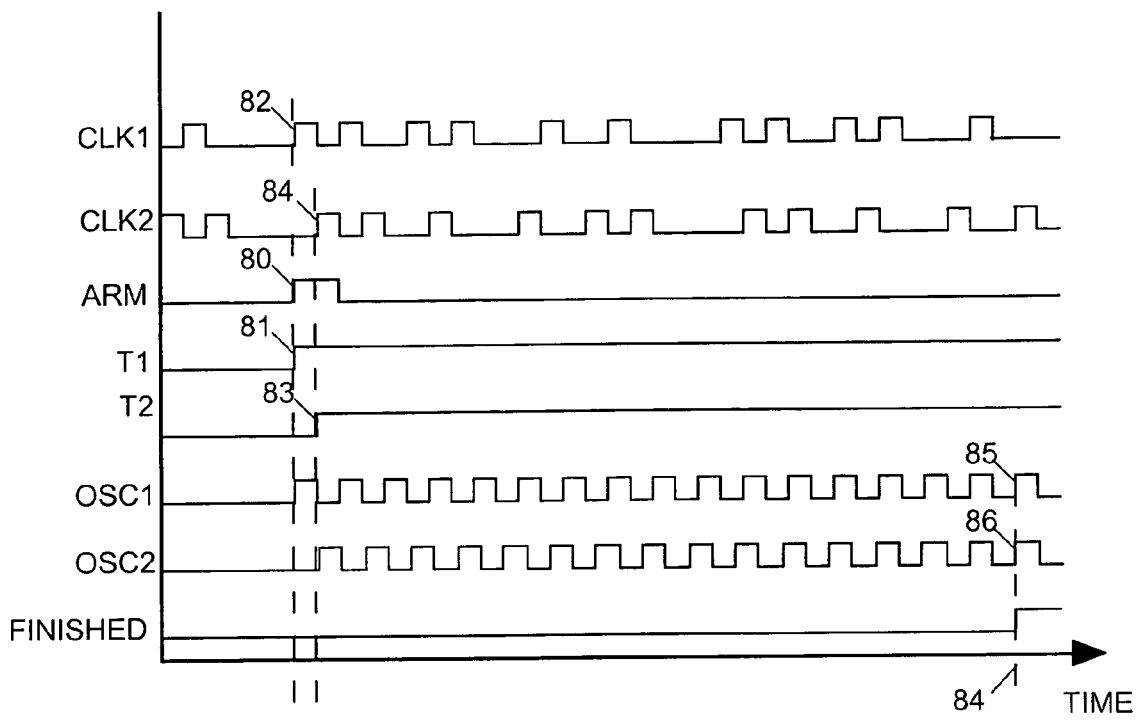
FIG. 8 is a timing diagram illustrating an example behavior of various signals of the TMU of FIG. 7 during a period measurement operation.

FIG. 7 illustrates TMU 66 of FIG. 5 in more detailed block diagram form and FIG. 8 is a timing diagram illustrating behavior of various signals of FIG. 7 during TMU operation when it measures a period between edges of the CLK1 and CL2 signals in response to an edge of its ARM signal input from multiplexer 65 of FIG. 5. TMU 66 includes a trigger logic circuit 68 for responding to an edge 80 of the ARM signal by generating an edge 81 of a signal T1 in response to a next leading edge 82 of the CLK1 signal, and by generating an edge 83 of a signal T2 in response to a next leading edge 84 of the CLK2 signal. For FPGA 50 to properly analyze the data (CNT1, CNT2) indicating measurement results it may be necessary for the FPGA to know whether edge 82 of the CLK1 signal preceded edge 84 of the CLK2 signal, so trigger logic circuit 68 asserts a CLK2_FIRST signal to tell FPGA 50 whether edge 82 preceded edge 84.

T1 and T2 signal edges 81 and 83 respectively trigger a pair of triggered oscillators 70 and 71 producing output signals OSC1 and OSC2 having slightly differing periods. A pair of multiplexers 75 and 76 controlled by data in registers 56 of FIG. 5 delivers OSC1 and OSC2 to clock inputs of a pair of counters 72 and 73. Counters 72 and 73 count cycles of the OSC1 and OSC2 signals. A coincidence detector 74 sets the FINISHED signal true at time 84 when the leading edges 85 and 86 of the OSC1 and OSC2 signals coincide. The FINISHED signal disables counters 72 and 73 so that they halt their counts and signals FPGA 50 of FIG. 4 to acquire and process the count data CNT1 and CNT2. After acquiring the CNT1 and CNT2 data, FPGA 50 pulses the RESET signal to reset the T1 and T2 outputs of trigger logic circuit 68 so that oscillators 70 and 71 stop generating OSC1 and OSC2. The RESET signal also resets coincidence detector 74 so that it begins looking for another coincidence in OSC1 and OSC2, and resets counters 72 and 73. The time delay (DELAY) between CLK1 signal edge 82 and CLK2 edge 84 can be determined from the CNT1 data alone. See U.S. Pat. No. 6,295,315 issued Sep. 25, 2001 to Frisch et al, incorporated herein by reference, for a description of a related TMU.

Trigger Circuit

Figure 9:
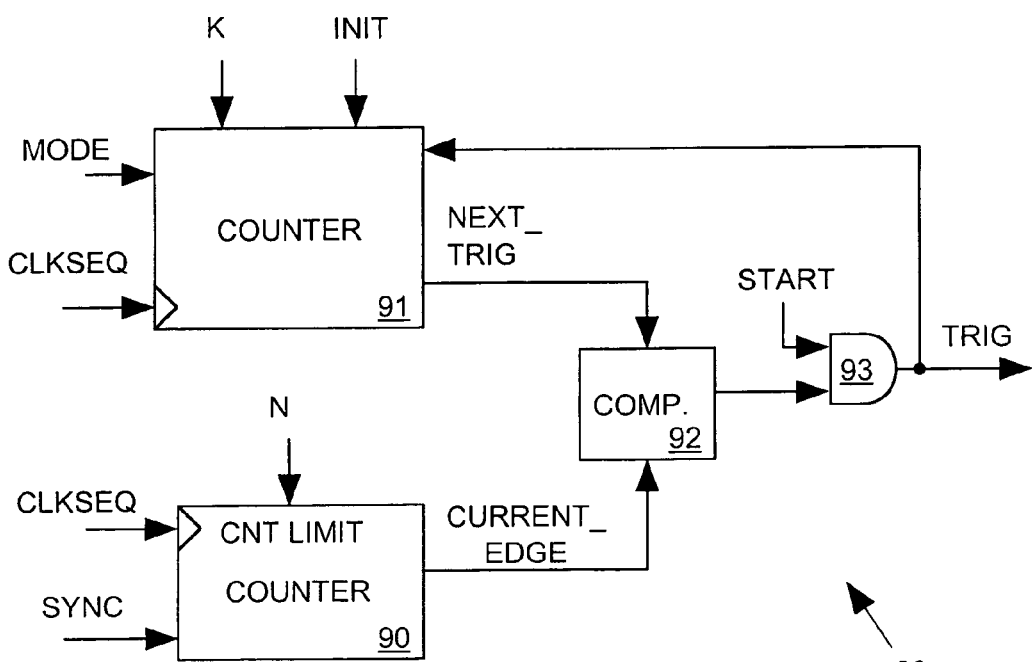
FIG. 9 depicts the trigger circuit of FIG. 5 in more detailed block diagram form.

FIG. 9 depicts trigger circuit 60 of FIG. 5 in more detailed block diagram form. Trigger circuit 60 can initiate digitizing or period measurement operations when the CLKSEQ signal is derived from a signal (VR, JITTER or ARM2) having a repetitive pattern. When armed by the ARM signal from FPGA 50 of FIG. 4 and triggered by the SYNC signal, trigger circuit 60 generates a series of TRIG signal edges in response to selected edges of that repetitive pattern. Host computer 28 can program trigger circuit 60 to generate successive TRIG signal edges in response to the same or different edges within successive CLKSEQ signal pattern repetitions. For example, when CK1, CLK2 and CLKSEQ are derived from a DUT output signal VR having a repetitive pattern, this series of TRIG signal edges can be used to signal digitizer 61 of FIG. 5 to repeatedly digitize CLK2 at times relative to selected edges of the VR signal or to signal TMU 66 to make a series of measurements of periods between edges of the VR signal.

When the CLKSEQ signal conveys a repetitive pattern, trigger circuit 60 can produce (at most) a single TRIG signal pulse during each repetition of the pattern when enabled by the START signal from FPGA 50. In a repetitive triggering mode, trigger circuit 60 always generates a TRIG signal pulse in response to the same particular edge of the repetitive pattern. Before generating the START signal FPGA 50 transmits a SYNC signal to trigger circuit 60 indicating when a particular edge of the CLKSEQ signal pattern has arrived. When the CLKSEQ signal pattern includes a known number N of edges, with the value of N being supplied by control registers 56 of FIG. 5, then the SYNC signal enables trigger circuit 60 to thereafter keep track of the current position of the CLKSEQ signal within the representative pattern by counting edges of the CLKSEQ signal. With the START signal from FPGA 50 asserted, then after receiving the SYNC signal, trigger circuit 60 generates a first TRIG signal edge on the Kth rising edge of the CLKSEQ pattern following assertion of the SYNC signal, where K is input data supplied by control registers 56 of FIG. 5. If the repetitive pattern has N edges, numbered from N−1 to 0 starting with the first edge following the SYNC signal edge and ending with the Nth edge, trigger circuit 60 generates a first TRIG edge on the first occurrence of the Kth edge following the SYNC signal. Control data (K) stored in registers 56 of FIG. 4 sets the value of K.

In an "equivalent time" triggering mode, trigger circuit 60 generates each edge of successive set of N TRIG signal edges in response to a different edge of the CLKSEQ pattern, with the edges being selected in sequential order starting with the edge selected by K. Trigger circuit 60 generates each of the next N−1 TRIG signal edges during successive repetitions of the pattern in the CLKSEQ signal on an occurrence of a separate one of the other N−1 edges In a "repetitive" triggering mode, trigger circuit 60 generates each edge of successive set of N TRIG signal edges in response to a separate occurrence of the same selected edge within the repetitive CLKSEQ pattern.

Trigger circuit 60 includes a counter 90 for responding to the SYNC edge by generating a data sequence CURRENT_EDGE by counting down from N−1 to 0 in response to successive leading edges of the CLKSEQ signal. Counter 90 restarts its count down at N−1 each time its count reaches 0. Input control data supplies the value of N where N is the number of leading edges in the repetitive pattern in the CLKSEQ signal. The pattern should always start with a rising edge and end with a falling edge. Thus the CURRENT_EDGE data indicates a number of the current edge of the CLKSEQ signal within the repetitive pattern. A peak-to-peak jitter operates in either of two modes selected by MODE control data from data processing unit 50 of FIG. 4.

In the repetitive triggering mode, counter 91 sets output data NEXT_TRIG equal to K when FPGA 50 toggles an INIT bit in control registers 56 of FIG. 4 and thereafter keeps NEXT_TRIG at that value. This causes trigger circuit 60 to produce all TRIG signal pulses in response to the same Kth edge of the repetitive CLKSEQ pattern. In the equivalent time triggering mode, pattern generator initially sets its NEXT_TRIG output data equal to K but changes its value in response to the next CLKSEQ edge each time the TRIG signal is asserted. Thus whenever CURRENT_EDGE matches NEXT_TRIG, comparator 92 and AND gate 93 assert the TRIG signal, provided the START signal is true, and the TRIG signal tells counter 91 to select another value for NEXT_EDGE in response to the next CLKSEQ edge. After trigger circuit 60 has generated N TRIG signal edges in the equivalent time triggering mode, counter 91 will have set NEXT_EDGE to every value between 0 and N−1 with values occurring in consecutive order beginning with STARTCNT and will then continue to repeat the same TRIG signal edge pattern as long as FPGA 50 continues to assert the START signal.

Figure 10:
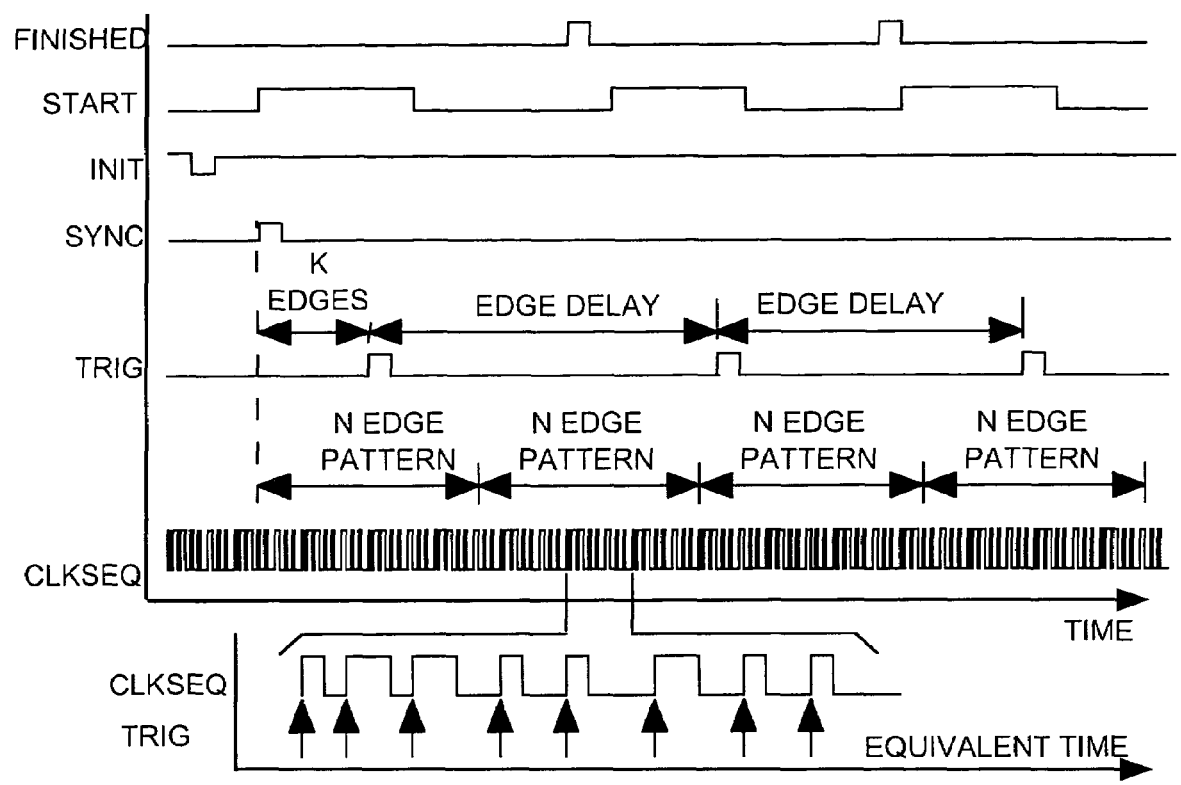
FIG. 10 is a timing diagram illustrating behavior of various signals of the trigger circuit of FIG. 5 during an equivalent time mode of operation.

FIG. 10 is a timing diagram illustrating behavior of various signals during the equivalent time triggering mode. To prepare trigger circuit 60 for operation, FPGA 50 of FIG. 4 initially loads the values of N and K into control registers 56 of FIG. 4 and then toggles the INIT control bit via control registers 56 to load K into counter 91. Counter 91 then sets NEXT_TRIG equal to K. FPGA 50 then sets START true to enable AND gate 93, and pulses the SYNC signal to mark the start of the repetitive pattern in CLKSEQ. When the Kth edge arrives, counter 90 begins decrementing CURRENT_EDGE on successive edges of the CLKSEQ signal. After N-K edges of the CLKSEQ signal, when CURRENT_EDGE matches NEXT_TRIG, comparator 92 signals AND gate 93 to generate a first TRIG signal pulse, and that TRIG signal pulse signals counter 91 to select a next value for NEXT_EDGE. The TRIG signal also tells FPGA 50 to turn off the START signal unit it detects that TMU 66 (FIG. 4) has set the FINISHED bit, indicating that it has completed measuring an interval in response to the TRIG signal edge. FPGA 50 then acquires the measurement data from TMU 66 and then reasserts the START signal if another measurement is needed. Comparator 92 and AND gate 93 then generate a next TRIG signal edge when CURRENT_EDGE next MATCHles NEXT_TRIG. FIG. 9 shows that in equivalent time, each TRIG signal edge coincides with a separate one of the leading edges of the repetitive CLKSEQ signal pattern.

When the MODE bit sets trigger circuit 60 for the repetitive mode of operation, peak-to-peak jitter sets NEXT_TRIG to the value of K and keeps it there so that NEXT_TRIG always has the same value. Thus when START is asserted, trigger circuit 60 always produces a TRIG signal edge when CURRENT_EDGE matches the value of K. Trigger circuit 60 therefore always produces TRIG signal edges in response to the same edge of the repetitive CLKSEQ signal pattern.

Operating Modes

Host computer 28 writes control data into registers 56 to configure measurement circuit 48 of FIG. 5 to operate in any of several operating modes.

In a "Scope" operating mode digitizer 61 acquires samples of the CLK2 signal in response to the TRIG signal to produce data (SDATA) that can be used, for example, to control waveform displays similar to those produced by a sampling oscilloscope.

In a "Frequency" operating mode TMU 66 measures the frequency or period of a signal and returns the results as CNT2 data.

In a "Vernier" operating mode, TMU 66 measures a period between edges of the CLK1 and CLK2 signals in response to a single TRIG signal edge.

In a "Sequencing" operating mode TMU 66 performs a series of period measurements in response to a succession of TRIG signal edges.

In a "Calibrate1" operating mode, TMU 66 measures periods of its internal oscillator output signals OSC1 and OSC2 for purposes of calibrating oscillators 70 and 71 of FIG. 7

In a "Calibrate3" operating mode, TMU 66 measures a period of OSC3 for purposes of calibrating oscillator 63 of FIG. 5.

High Level Commands

FPGA 50 responds to the following high level commands from host computer 28: PERIOD, READCNTR1, SYNCHRONIZE, SINGLEMEASURE, HISTOGRAM, LOGGING, and BINNING.

The PERIOD command tells FPGA 50 to assert the ARM1 signal for a known period of time and to signal TMU 66 to count the number of cycles of the CLK1 and CLK2 signals occurring between the rising and falling edges of the ARM1 signal., Since FPGA 50 asserts the ARM1 signal for a predetermined number of cycles of the FPGA's master clock (MCLK), each count (CNT1 and CNAT2) reaches a value during that time that is proportional to the frequency of the signal whose edges are being counted. In particular, the signal frequency is equal to the product of the MCLK signal frequency and the count, divided by the number of MCLK cycles FPGA 50 asserts the ARM1 signal. The PERIOD command therefore enables the host computer to determine the frequency (or period) of each of the CLK1 and CLK2 signals.

With measurement circuit 48 configured for Calibrate1 or Calibrate3 operating modes, those signals could be the output signals of any two of the three adjustable frequency oscillators (63, 70, 71) within measurement circuit 48 used as timing references during digitizing and time measurement operations. The resulting data enables host computer 28 to calibrate the operating frequencies of those oscillators.

With measurement circuit 48 configured for the Frequency operating mode, the PERIOD command enables host computer 28 to determine the period or frequency of the sources of signals CLK1 and CK2 supplied by a multiplexer 58 controlled by control data stored in control registers 56. Multiplexer 58 selects the sources of CLK1 and CLK2 signal from among a JITTER signal, an ARM2 signal and a pair of signals V1 and V2 produced by a comparator 52. When the host computer configures jitter generator 46 of FIG. 4 to generate a periodic JITTER signal, the host computer can use the PERIOD command to have TMU 66 measure the period of the JITTER signal. The resulting data TMU 66 generates enables host computer 28 to calibrate jitter generator 46. The V1 and V2 signals are derived from the DUT output signal VR. Signal V1 is true when VR is higher in voltage than a signal VH produced by a digital-to-analog converter (DAC) 53 controlled by data stored in registers 56. Signal V2 is true when VR is lower in voltage than a signal VH produced by a digital-to-analog converter (DAC) 53 controlled by data stored in registers 56. Host computer 28 could use a PERIOD command to have TMU 66 measure the period (and therefore the frequency) of DUT output signal VR when it is a periodic signal by measuring the period between edges of the V1 or V2 signal. FPGA 50 generates the ARM2 signal with a period that is a multiple of the period of the MCLK signal. The host computer can use the PERIOD command to measure the period of the ARM2 signal.

The READCNTR1 command tells FPGA 50 to read one of the data outputs (CNT1) of TMU 66, when CNT1 conveys the count TMU 66 produces in response to a PERIOD command.

The SYNCHRONIZE command tells FPGA 50 to assert a synchronization signal (SYNC) on occurrence of a particular point in a repetitive pattern appearing the CLKSEQ signal. As discussed above, the SYNC signal synchronizes the timing of TRIG signal edges trigger circuit 60 to an identifiable point in the CLKSEQ signal pattern. Host computer 28 sends a SYNCHRONIZE command to FPGA 50 before sending it a command requiring the use of trigger circuit 60

The SINGLEMEASURE command tells FPGA 50 to use TMU 66 to measure the time difference between leading edges of the CLK1 and CLK2 signals. For example, it is possible for TMU 66 to measure the skew of DUT output signal VR by measuring the period between an edge of the VR signal and an edge of the ARM2 signal. Host computer 28 may issue a SINGLEMEASURE command with measurement circuit 48 either in the Vernier, Sequencing or Scope operating mode.

In the vernier mode, the SINGLEMEASURE command tells FPGA 50 to transmit an ARM1 signal edge to a multiplexer 65 to supply the ARM signal input to TMU 66. The ARM signal edge tells TMU 66 to carry out the measurement relative to the next two leading edges of the CLK1 and CLK2 signal. The output data CNT1 and CNT2 of TMU 66 indicates the measured period between those two CLK1 and CLK2 signal edges. A CLK2_FIRST bit TMU 66 provides indicates whether the CLK2 edge occurred before the CLK1 edge. TMU 66 sets the FINISHED bit to indicate when the measurement is complete and the CNT1 and CNT2 data is ready A sequencing mode SINGLEMEASURE command is similar to a vernier mode SINGLEMEASURE command except that trigger circuit 60 supplies a trigger signal (TRIG) for controlling the ARM signal input to TMU 66. Trigger circuit 60 asserts the TRIG signal repeatedly, synchronizing it to selected edges of the CLOCKSEQ signal. TMU 66 may make more than one measurement in response to a sequencing mode SINGLEMEASURE command. Host computer 28 supplies control data to FPGA 50 indicating the number of measurement repetitions to be performed. For example, when the CLKSEQ signal is derived from a DUT output signal VR conveying a repetitive pattern, FPGA 50 can set a MODE control bit in registers 56 to tell trigger circuit 60 to operate in a repetitive triggering mode where it asserts the TRIG signal repeatedly at the same point in the pattern so that TMU 66 repeatedly measures the period between the same two edges within the pattern. Before supplying a sequencing mode SINGLEMEASURE command to FPGA 50, host computer 28 sends it a SYNCHRONIZE command and FPGA 50 responds by supplying a SYNC signal to synchronize the TRIG signal output of trigger circuit 60 to the pattern before signaling trigger circuit 60 via a START signal to begin generating TRIG signals in response to the SINGLEMEASURE command. FPGA 50 can process the data derived from these repeated sequencing mode period measurements, for example, to determine the amount of random jitter in DUT output signal VR.

Alternatively FPGA 50 can set the MODE bit to configure trigger circuit 60 to operate in an equivalent time triggering mode where it asserts the TRIG signal at different points during successive repetitions of the VR signal pattern so that TMU 66 measures the period between a different pair of edges within the repetitive pattern following each TRIG signal assertion. As discussed below, FPGA 50 can process period data collected in this fashion quantify the deterministic or pattern-dependant jitter in DUT output signal VR.

A scope mode SINGLEMEASURE command tells FPGA 50 to configure MEASUREMENT CIRCUIT 48 to respond to the TRIG signal produced by trigger circuit 60 by storing 12 successive samples of the CLK2 signal in a shift register 64 and to supply a 12-bit SDATA word resenting the 12 sampled states of the CLK2 to FPGA 50. Since TMU 66 is not used in this mode, FPGA 50 initially sets multiplexer 65 to supply a hard-wired 0 to the ARM input of TMU 66 so that the TRIG signal does not trigger a TMU measurement operation. Instead, a synchronizing circuit 62 responds to the TRIG signal edge by triggering an oscillator 63 on the next edge of the CLK1 signal. Following a delay controlled by data in registers 56, oscillator 63 begins generating a periodic output signal OSC3 for clocking shift register 64 so that it samples CLK2 and stores the resulting 12-bit SDATA. The frequency and triggering delay of triggered oscillator 63 are determined by control data in registers 56 supplied by FPGA 50 in response to data supplied by host computer 28 in connection with the SINGLEMEASURE command. Shift register 64 sets the FINISHED bit true when it has captured the 12 samples to tell FPGA 50 that sample data is ready. FPGA 50 then generates a REST signal to stop oscillator 63, to reset synchronizing circuit 62 and to clear shift register 64.

The HISTOGRAM command tells FPGA 50 to acquire a set of period measurements from TMU 66 and to store data representing a histogram of that data in RAM 51 so that host computer 28 can access it. The histogram is in the form of a data sequence in which each element of the sequence corresponds to a different range of periods and indicates a number of period measurements falling within that range. Host computer 28 can use the histogram data, for example, to calculate the non-deterministic jitter in a signal or to determine the average period between edges of a periodic signal more accurately than with only a single period measurement.

The LOGGING command tells FPGA 50 to perform up to 256 FPGA SINGLEMEASUREMENT operations with the same setting and to save the least significant 12 bits of each measurement result in RAM 51.

A BINNING command is specifically designed for use in testing a SERDES DUT output signal VR. Digital signals, including SERDES signals, are typically produced at some clock period P such that the nominal period between successive transitions of the VR signal is some multiple of P, although jitter in the signal can cause actual periods between edges to vary somewhat. During the test carried out in response to a BINNING command, the DUT produces a particular repetitive pattern in its output signal wherein the nominal period between successive edges ranges from 1P to 5P. The BINNING command tells FPGA 50 to configure TMU 66 to carry out a large number of period measurements with trigger circuit 60 set in its sequencing mode of operation wherein it triggers period measurements at varying times during the pattern so that TMU 66 measures the period between each pair of successive edges within the repetitive pattern several times. FPGA 50 assigns each period measurement data value to one of a set of five "bins", each corresponding to a separate one of the five possible nominal edge-to-edges delays from 1P to 5P. Due to signal jitter, each measurement may vary somewhat from a multiple of P, but FPGA 50 assigns each measurement to the bin corresponding to the delay nearest the measured period. FPGA 50 then stores data in RAM 51 indicating the longest and shortest delay assigned to each bin. The resulting data indicates the pattern dependant jitter in the DUT output signal VR.

FPGA

FPGA 50 of FIG. 4 includes logic programmed for carrying out several functions, and though in the preferred embodiment of the invention an FPGA implements those functions, those of skill in the art will appreciate the such functions could be implemented by other types of programmable logic circuits or by one or more application specific ICs (ASICs).

FPGA 50 provides an interface between bus 30 and IC 47 enabling host computer 28 of FIG. 3 to supply control and programming data to transmitter circuit 34, receiver circuit 33 and measurement circuit 48 for setting up those circuits to carry out various tests. As discussed above, FPGA 50 also acts as a pattern generator for supplying input signals to transmitter circuit 34 and for receiving, storing and/or processing output data produced by receiver 33 and measurement circuit 48.

Figure 11:
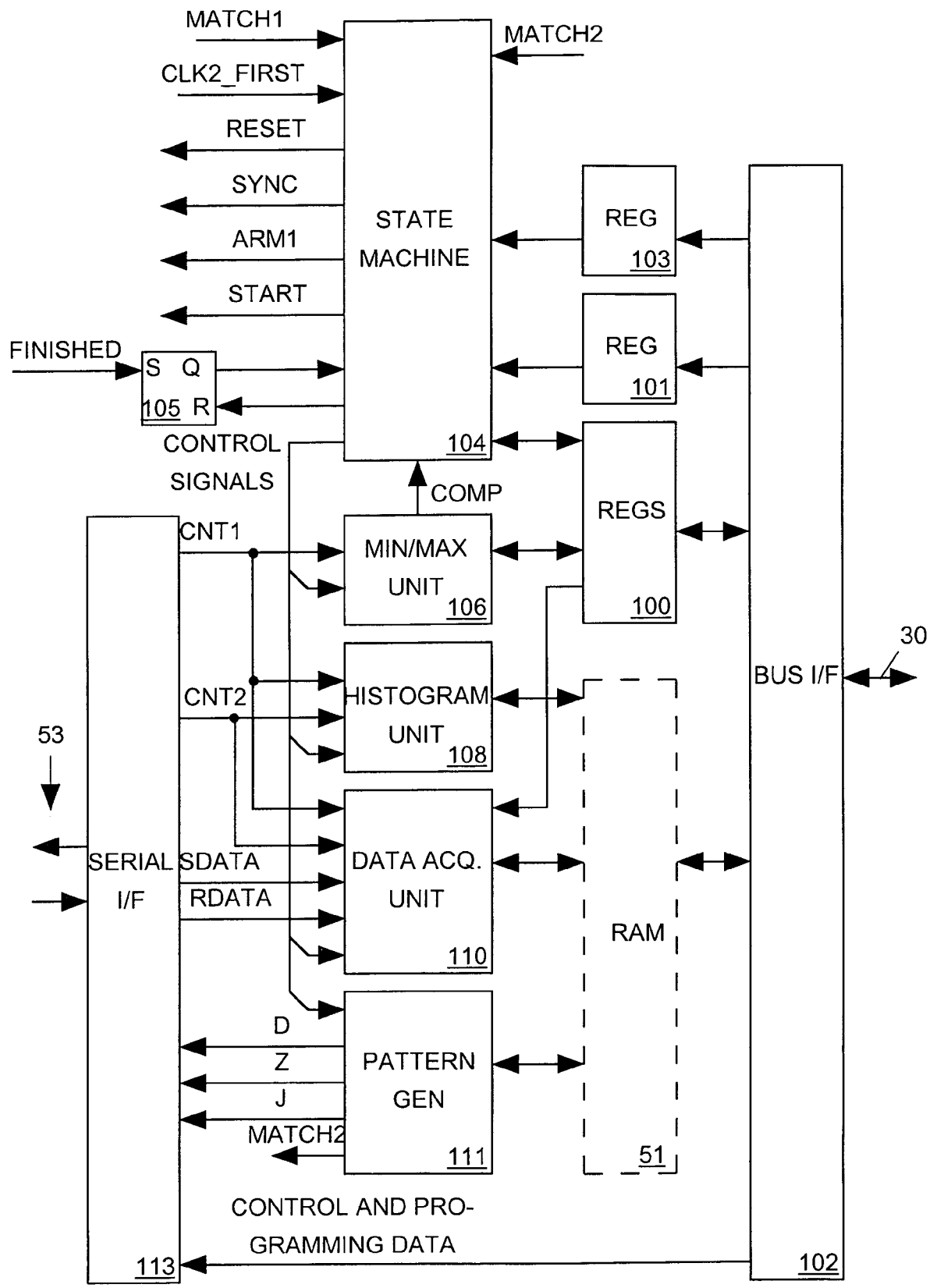
FIG. 11 depicts logic implemented by the field programmable gate array (FPGA) of FIG. 4 in block diagram form.

FIG. 11 depicts logic implemented by FPGA 50 of FIG. 4 in more detailed block diagram form. As shown in FIG. 11, FPGA 50 implements a set of "binning" registers 100, a command register 101, and a bus interface 102 providing host computer 28 of FIG. 3 with read and write access to registers 100, with read and write access to RAM 51 of FIG. 4 and with write access to registers 56 of FIG. 4. FPGA 50 also implements a state machine 104 for responding to various commands and data that host computer 28 writes into registers 100 and to MATCH1, MATCH2 and CLK2_FIRST signal inputs by supplying the RESET, SYNC, ARM1 and START signal inputs to measurement circuit 48 of FIG. 5 and by supplying control singles to other functional blocks of FPGA 50. FPGA 50 also implements a min/max unit 106, a histogram unit 108 and a data acquisition unit 110 for processing data from measurement circuit 48 of FIG. 5. A pattern generator 111 supplies the D, Z and J data patterns to transmitter circuit 34 of FIG. 4 and a MATCH2 signal input to state machine 104 based on pattern data host computer 28 stores in RAM 51. A serial interface circuit 113 multiplexes control and data signals onto serial signals 53 to and from serial interface 49 of FIG. 4.

Min-Max Unit

Figure 12:
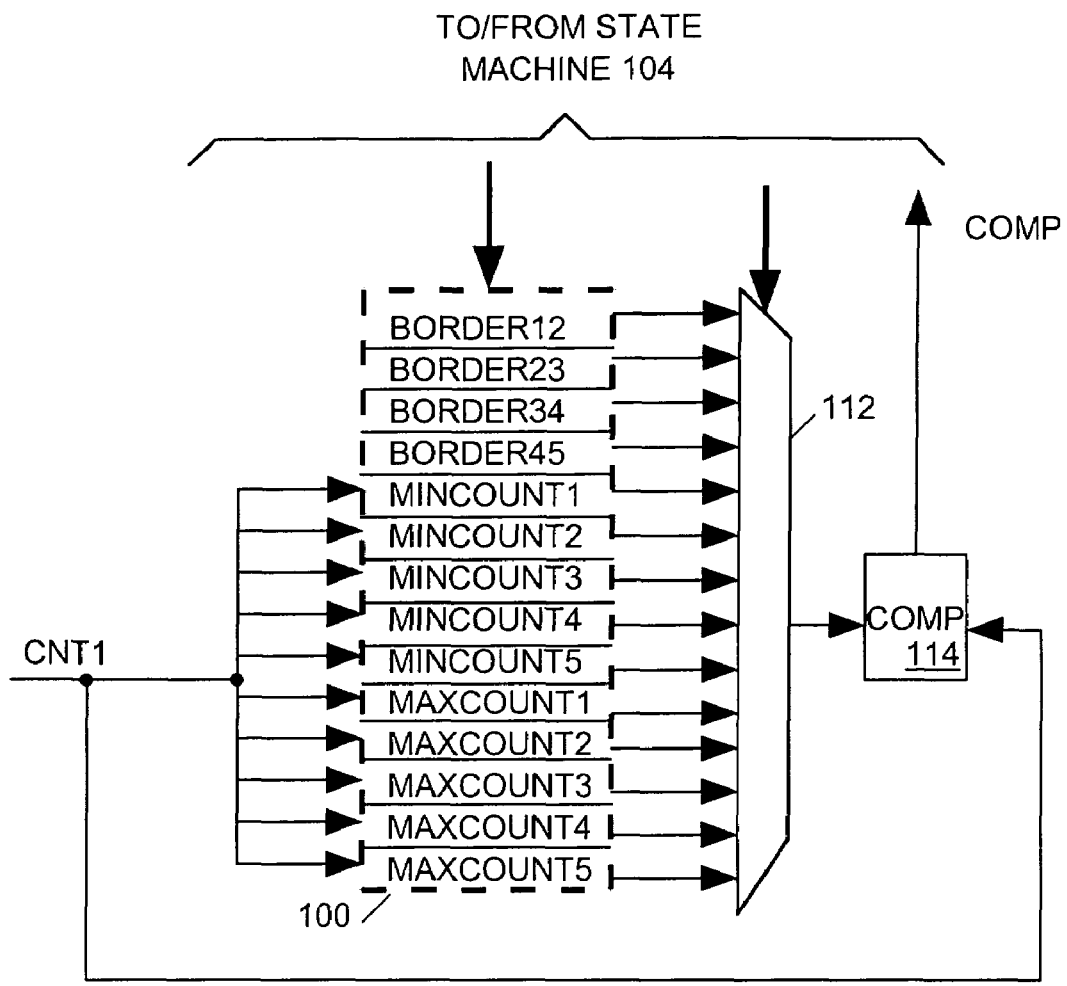
FIG. 12 illustrates the min-max unit of FIG. 11 in more detailed block diagram form.

FIG. 12 illustrates min-max unit 106 of FIG. 11 in more detailed block diagram form. State machine 104 makes use of min/max unit 106 to carry out a BINNING command from host computer 28. Before writing the BINNING command to command register 101, host computer 28 writes control data into registers 56 of FIG. 4 suitably adjusting the outputs VH and VL of DACs 53 and 54 and setting multiplexer 58 of FIG. 5 to select V1 and V2 as the CLK1 and CLK2 sources, and to select V1 as the CLKSEQ source. During execution of the BINNING command, TMU 66 of FIG. 5 measures time intervals between successive edges of the DUT output signal VR following each TRIG signal edge. With trigger circuit 60 configured to operate in the equivalent time triggering mode, the TRIG signal it produces tells TMU 66 to generate a sequence of CNT1 values representing the time interval between every pair of successive edges of the VR signal pattern. Min/max unit 106 enables state machine 104 to monitor the CNT1 values generated in response to the BINNING command and to write data into registers 100 characterizing the pattern dependant peak-to-peak jitter in DUT output signal VR.

Figure 13:
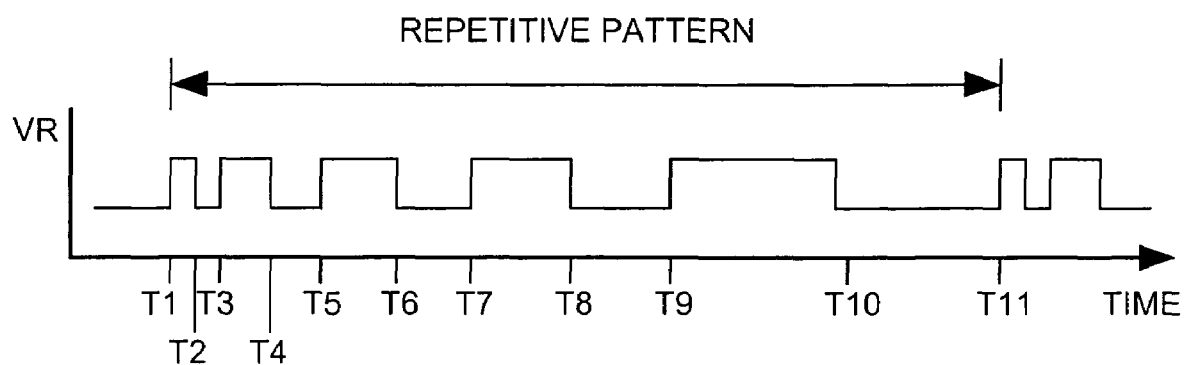
FIG. 13 is a timing diagram illustrating an example of a repetitive pattern that an output signal of a device under test could convey.

FIG. 13 is a timing diagram illustrating an example of a repetitive pattern that the DUT output signal VR might convey during a peak-to-peak jitter measurement test. Ideally the VR signal pattern will have edge transitions at relative times T1-T11 during each repetition of the pattern. In this particular sample, given a unit delay D, the expected edge-to-edge delays are as follows:

T2-T1=T3-T2=D

T4-T3=T5-T4=2D

T6-T5=T7-T6=3D

T8-T7=T9-T8=4D

T10-T9=T11-T10=5D

In the absence of jitter in DUT output signal VR, we would expect each value of the CNT1 output sequence of TMU 66 (FIG. 5) to represent one of those five different delays whenever it measures a delay between any one edge and the next in the repetitive pattern. However when there is some amount of jitter in DUT output signal VR, each value of the CNT1 output sequence will represent a value that is close to one of those five different delays but which may be a little higher or lower.

State machine 104 (FIG. 11) uses min-max circuit 106 to sort the CNT1 data generated by TMU 66 into five different bins corresponding five different delay ranges. For the example pattern of FIG. 13, min-max circuit 106 could establish the following delay ranges:

Range 1: less than 1.5D
Range 2: 1.5D to 2.5D
Range 3: 2.5D to 3.5D
Range 4: 3.5D to 4.5D
Range 5: greater than 4.5D Given a moderate amount of jitter, we would expect a delay between successive edges that is nominally either D, 2D, 3D, 4D or 5D to fall either within Range 1, 2, 3, 4 or 5, respectively. Min-max circuit 106 monitors the CNT1 output sequence of TMU 66 to determine the range in which each CNT1 value falls, and keeps track of the highest and lowest observed values within each range. When the CNT1 sequence represents several measurements of the interval between each adjacent pair of rising and falling edges within the repetitive pattern, then the largest difference between highest and lowest observed values within any of the five ranges is a measure of the peak-to-peak jitter in DUT output signal VR.

Min-max circuit 106 of FIG. 12 includes a multiplexer 112 and a comparator 114. The CNT1 output of TMU 66 of FIG. 5 provides a data input to each of a set ten of registers 100 of FIG. 4 and state machine 104 of FIG. 11 can write enable any of those ten registers. Multiplexer 112, controlled by data from state machine 104, can supply the contents of any one of 14 registers 100 as input to comparator 114. Comparator 114 compares CNT1 to the output of multiplexer 112 to provide a signal COMP indicating whether CNT1 is less than the output of multiplexer 112.

Four of registers 100 store data (BORDER12, BORDER23, BORDER34 and BORDER35) provided by host computer 28 indicating the borders between the five ranges of CNT1 data values. For the example pattern of FIG. 13, host computer 28 would select the following values:

BORDER12=1.5D'
BORDER23=2.5D'
BORDER34=3.5D'
BORDER45=4.5D'

D' is the value of CNT1 representing the nominal unit delay D. Another five of registers 100 store data (MINCOUNT1 to MINCOUNT5) indicating the smallest observed values of CNT1 for each of the five ranges. The last five of register 100 store data (MAXCOUNT1 to MAXCOUNT5) indicating the largest observed values of CNT1 for each of the five ranges.

To initiate a peak-to-peak jitter measurement, the host computer 28 first configures trigger circuit 60 of FIG. 5 to operate in the equivalent time triggering mode, sets multiplexer 58 (FIG. 4) to select V1 and V2 as the CLK1 and CLK2 signals and to select V1 as the CLKSEQ signal, and appropriately sets the outputs VH and VL of DACs 53 and 54. Host computer 28 also writes the appropriate values of the BORDER data into registers 100** to establish the ranges of interest, and writes the nominal delay for each range as initial MINCOUNT* and MAXCOUNT* data in registers 110. Thus for the example pattern of FIG. 13 the host computer would initialize the registers as follows:

BORDER12=1.5D'
BORDER23=2.5D'
BORDER34=3.5D'
BORDER45=4.5D'
MINCOUNT1=CNT1MAX

MINCOUNT2=CNT1MAX
MINCOUNT3=CNT1MAX
MINCOUNT4=CNT1MAX
MINCOUNT5=CNT1MAX
MAXCOUNT1=0
MAXCOUNT2=0
MAXCOUNT3=0
MAXCOUNT4=0
MAXCOUNT5=0

CNT1MAX is the maximum possible value of CNT1.

Host computer 28 also writes data to register 103 (FIG. 11) indicating the number of samples to be acquired. Host computer 28 next writes a SYNCHRONIZE command into register 101 (FIG. 5) telling state machine 104 to transmit a SYNC signal to trigger circuit 60 in response to the next occurrence of the MATCH1 signal. Thereafter host computer 28 writes a BINNING command into register 101 causing state machine 104 to begin BINNING operation.

Figure 14:
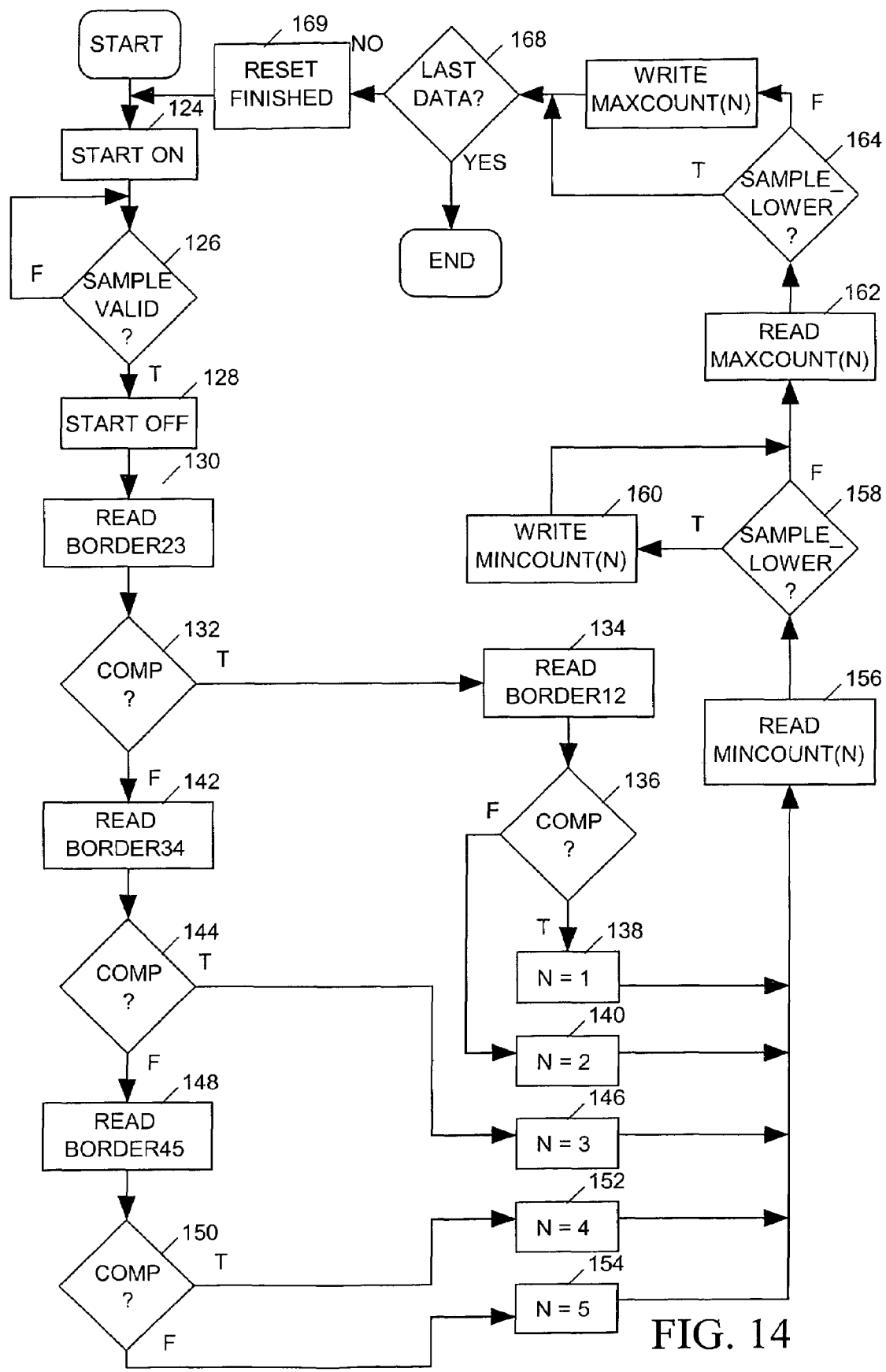
FIG. 14 is a flow chart depicting behavior of the state machine of FIG. 11 when executing a BINNING command.

FIG. 14 is a flow chart depicting the logic of state machine 104 of FIG. 11 when executing the BINNING command. State machine 104 initially turns on the START signal input to trigger circuit 60 of FIG. 5 to permit the sequencer to begin generating TRIG signal edges (step 124) after it receives a SYNC single edge. The TRIG signal edges cause TMU 66 to make a first interval measurement. State machine 104 waits (step 126) until it detects that valid CNT1 data is available. TMU 66 sets the FINISHED bit true in a register 105 (FIG. 11) when it generates the CNT1 data indicating the results of the first measurement. If the data is not valid it sets CLK2_FIRST true. When the CNT1 data is valid, state machine 104 sets multiplexer 112 to deliver the BORDER23 data to comparator 114 so that comparator 114 can compare CNT1 to BORDER23 (step 130). When the COMP output of comparator 114 is true, indicating that CNT is lower in value then BORDER23 (step 132), then the CNT1 data must be either in Range 1 or 2. State machine 104 then sets multiplexer 112 to deliver the BORDER12 data to comparator 114 (step 134) so that the COMP output of comparator 114 will indicate whether CNT1 is in Range 1 or 2. State machine 104 determines CNT1 is in Range 1 (N=1) when COMP is true (step 138) and in Range 2 (N=2) when COMP is false (step 140). When CNT1 is not in Range 1 or 2, then COMP will be false at step 132 and state machine 104 sets multiplexer 112 to deliver BORDER34 to comparator 114 (step 142). If COMP is then true, state machine 104 determines CNT1 is in Range 3 (N=3) at step 146, otherwise at step 148 state machine signals comparator 114 to deliver BORDER45 to comparator 114 (step 148). The COMP output of comparator 114 will now be true if CNT1 is in Range 4 (N=4) (step 152). Otherwise state machine 104 will determine CONT1 is in Range 5 (N=5) (step 154).

After determining the range N in which CNT1 lies at one of steps 138, 140, 146, 152 or 154, state machine 104 sets multiplexer 112 to deliver MINCOUNT(N) to comparator 114 so that COMP will indicate whether the current value of CNT1 is lower than the current value of MINCOUNT(N). If so, state machine writes CNT1 into the registers 110 storing MINCOUNT(N) (step 160). At step 162, state machine 104 sets multiplexer 112 to select MAXCOUNT(N) so that COMP will indicate whether the current value of CNT1 is lower than the current value of MAXCOUNT(N) (step 164). If COMP is false, state machine 104 writes CNT1 into the registers 100 MAXCOUNT(N) (step 166). State machine 104 keeps track of the number of interval measurements it has processed, and if has not processed the last measurement data (step 168), it resets the FINISHED bit in register 105 (FIG. 11) and returns to step 124 to start a next interval measurement. If all interval measurements have been processed, state machine 104 ends the measurement process following step 168.

Histogram Unit

Figure 15:
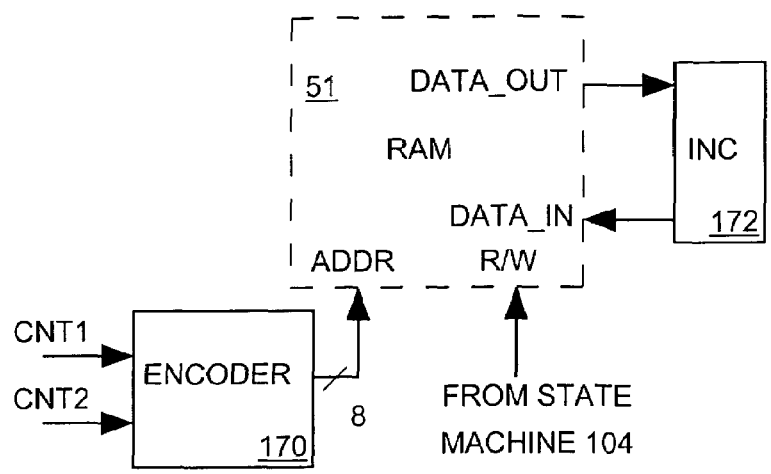
FIG. 15 depicts the histogram unit of FIG. 11 in more detailed block diagram form.

FIG. 15 depicts histogram unit 108 of FIG. 11 in more detailed block diagram form. State machine 104 of FIG. 11 makes use of histogram unit 108 when responding to HISTOGRAM command. The HISTOGRAM command tells state machine 104 to acquire a set of period measurements from TMU 66 of FIG. 4 and to store data representing a histogram of those measurements in RAM 51 so that host computer 28 can access it. The histogram is in the form of a sequence of 256 data elements wherein each element corresponds to a different range of period measurements and indicates a number of period measurements falling within that range. Host computer 28 can use the histogram data, for example, to calculate the non-deterministic jitter in a signal or to determine the average period between edges of a periodic signal more accurately than with only a single period measurement.

Before issuing a HISTOGRAM command, host computer 28 sets all the data values stored in the first 256 address of RAM 51 to a 0 and switches multiplexer 58 (FIG. 4) to select V1 and V2 as the sources of CLK1, CLK2 and CLKSEQ and configures trigger circuit 60 to operate in the repetitive triggering mode. In that mode trigger circuit 60 generates a TRIG signal in response to the same particular edge during each repetition of the repetitive pattern appearing in the CLKSEQ signal. The CLK1 and CLK2 signals will also convey repetitive patterns, and TMU 66 will respond to each TRIG signal edge by measuring the interval between the same two CLK1 and CLK2 edges of their repetitive patterns. The amount of variation in successive interval measurements indicates the amount of random jitter in DUT output signal VR. The combination of values CNT1 and CNT2 TMU 66 generates after each trigger signal represents the measured value of the interval. Host computer 128 also writes the number of measurements to be made into register 103. After issuing a SYNCHRONIZE command causing state machine 104 to send a SYNC signal to trigger circuit 60 (FIG. 4) on the next MATCH1 signal edge, host computer 128 issues the HISTOGRAM command. State machine 104 then initiates the first measurement by sending a START signal to trigger circuit 60. When valid CNT1 and CNT2 data is available, an encoder 70 (FIG. 14) encodes the CNT1 and CNT2 data into an 8-bit RAM address representing the period indicated by the CNT1 and CNT2 data with 8-bit resolution. RAM 51 reads out a count stored at that address to an increment circuit 172 which increments the count and supplies it to the data input terminals of RAM 51. State machine 104 then initiates a write operation overwriting the count at that address with the incremented count. When state machine 104 repeats this operation for every period measurement, the resulting data in the first 256 address of RAM 51 will be a histogram of the period measurements.

Figure 16:
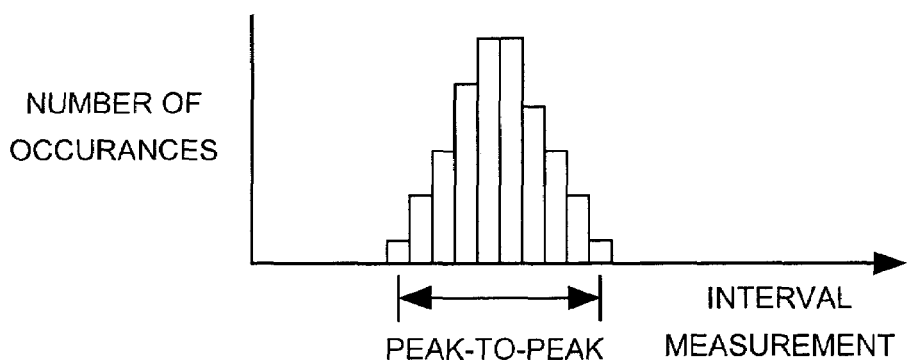
FIG. 16 is an example histogram derived from data generated by the histogram unit of FIG. 15.

FIG. 16 is an example histogram plotting the number of occurrences of each measured interval that can be constructed from the data stored in RAM 122 after histogram unit 108 has processed a large number of interval measurements. The peak-to-peak jitter due to random noise is the difference between the highest and lowest interval measurement. U.S. Pat. No. 4,774,681 issued Sep. 27, 1988 to Frisch and incorporated herein by reference describes a similar histogram unit.

Data Acquisition Unit

Figure 17:
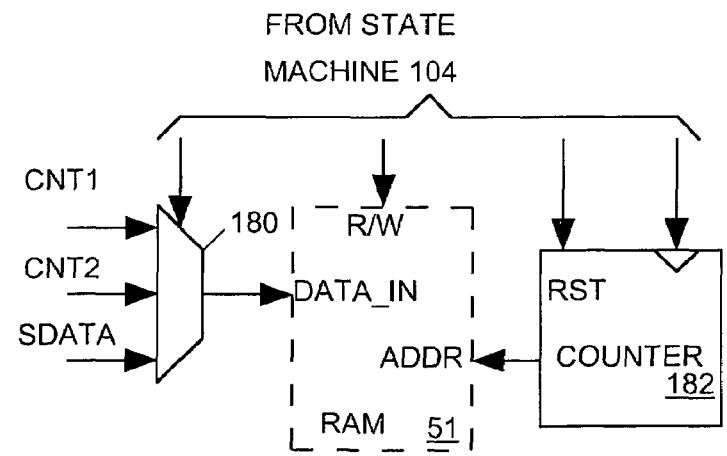
FIG. 17 depicts the data acquisition unit of FIG. 11 in more detailed block diagram form.

FIG. 17 depicts the data acquisition unit 110 of FIG. 11 in more detailed block diagram form. State machine 104 employs data acquisition unit 110 to write data to RAM 51 when executing SINGLEMEASUREMENT, READCNTR1 and LOGGING commands. Data acquisition unit 110 includes a multiplexer 180 controlled by data from state machine 04 for selecting one of CNT1, CNT2 and SDATA as the data input to RAM 51. A counter 182 supplies an address for RAM 51. State machine 104 can reset the count of counter 182 to 0 and can signal it to increment its count. State machine 104 also write enables RAM 51 when data is to be written into the RAM.

Jitter Generator

Figure 18:
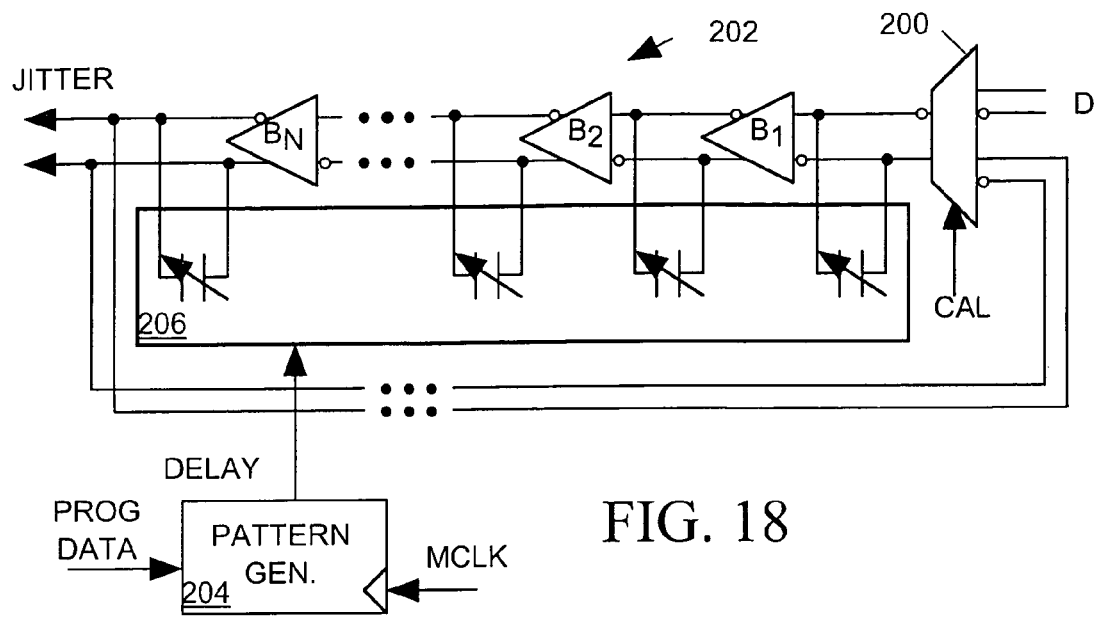
FIG. 18 depicts an example jitter generator in accordance with the invention in block diagram form.

FIG. 18 illustrates an exemplary embodiment of programmable "jitter generator" 46 of FIG. 4 for adding a controlled amount of jitter to the digital test signal D to produce a jittery DUT signal (JITTER) that may be supplied via multiplexer 42 and driver 44 as the DUT input signal VT. For example when the D signal is a clock signal having periodic rising and falling edges, the JITTER signal will be a jittery clock signal having the same average period as the D signal, but the timing of rising and falling edges of the JITTER signal will vary in a controlled manner relative to corresponding edges of the VT signal. The D signal could also be a digital data signal having edges synchronized to a periodic clock signal, and in that case, the JITTER signal will be a jittery data signal wherein edge timing varies relative to edges of the clock signal.

Jitter generator 46 of FIG. 18 includes a multiplexer 200, a programmable delay circuit 202, and a programmable pattern generator 204. In the jitter generator's normal operating mode, multiplexer 200 delivers the D signal to delay circuit 202 which delays the D signal by varying amounts of time to produce a jittery JITTER signal. Clocked by the MCLK signal, pattern generator 204 supplies a sequence of digital DELAY words to delay circuit 202, and each successive DELAY word controls its delay. With pattern generator 204 programmed to produce a suitable DELAY data sequence, jitter generator 46 can produce a JITTER signal having any of a wide variety of jitter frequencies and amplitudes.

Programmable delay circuit 202 preferably includes a cascaded set of inverting buffers B1-BN and a bank of capacitive circuit elements 206 providing loads of adjustable capacitance at the outputs of multiplexer 200 and buffers B1-BN. Each successive DELAY data word controls the capacitance of capacitive circuit elements 206, and by increasing or decreasing their capacitance, a DELAY data word can increase or decrease the delay of delay circuit 202. Thus, the pattern of DELAY data words provided by pattern generator 204 determines the nature of the jitter in the JITTER signal. To program jitter generator 46 to produce a desired jitter pattern in the JITTER signal, host computer 28 programs pattern generator 46 via input programming data to produce an appropriate DELAY word sequence.

Variable Capacitance

Figure 19:
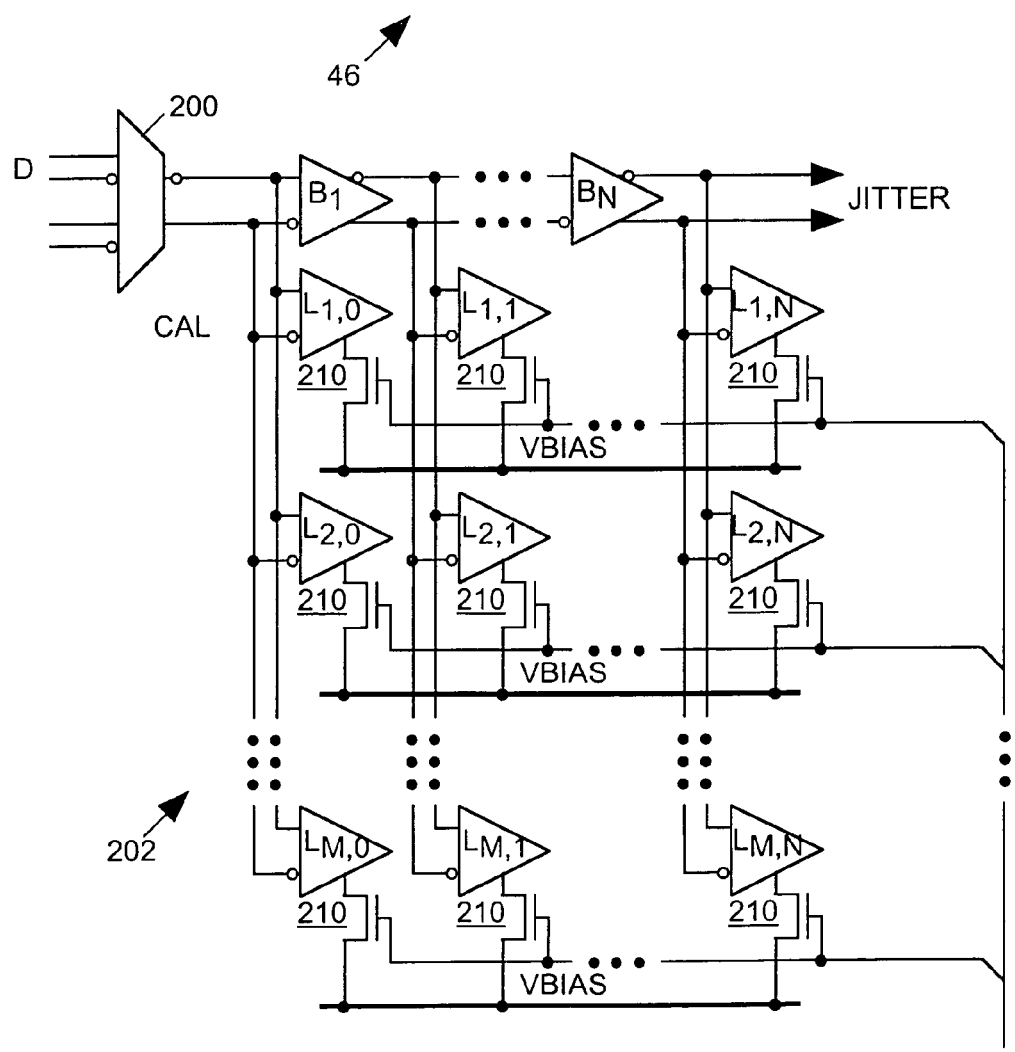
FIGS. 19-21 depict in block diagram form alternative exemplary embodiments of the programmable delay circuit of FIG. 18

Various ways of implementing capacitive circuit elements 206 of FIG. 18 are possible. For example, FIG. 19 depicts the variable capacitors as an array of gates L1,0-LM,N, such as buffers or other types of gates, having inputs connected in parallel with the outputs of multiplexer 200 and buffers B1-BN. Bits of each successive DELAY word control transistor switches 210 for selectively connecting each gate to a bias supply (VBIAS). When switches 212 connect any row of gates L1,0-LM,N to bias supply VBIAS, the capacitive load they provide at the outputs of multiplexer 200 and buffers B1-BN increases due to the well-known Miller effect.

Figure 20:
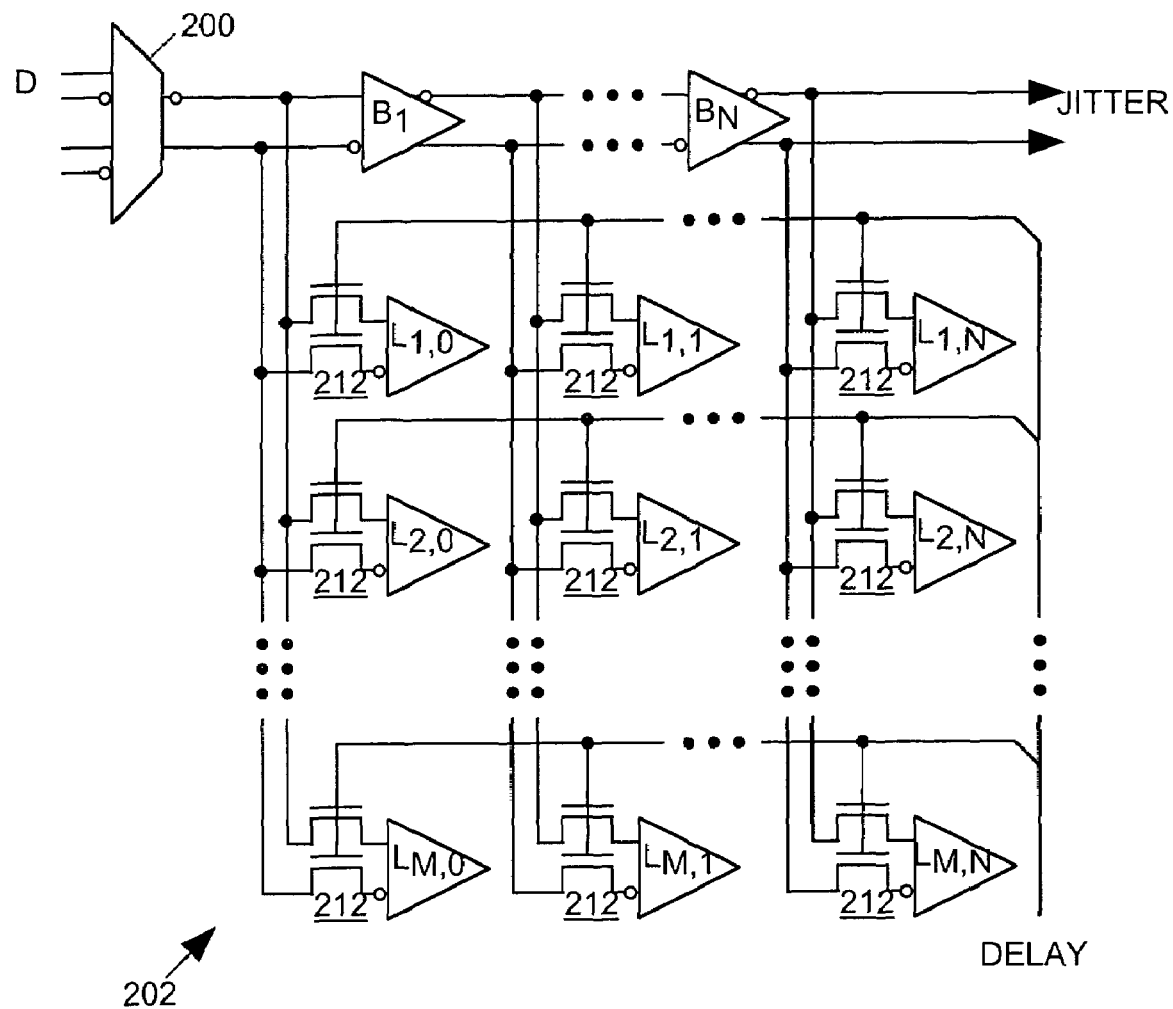

Alternatively, as illustrated in FIG. 20, a set of switches 212 controlled by bits of each DELAY word can connect inputs of selected ones of load gates L1,0-LM,N to outputs of multiplexer 200 and buffers B1-BN. Each load gate L1,0-LM,N is continuously connected to its bias and power supply sources. All load gates L1,0-LM,N of either FIG. 19 or 20 may be identical, or they may be formed of transistors of varying size so that the load gates provide substantially differing amounts of load capacitance. For example load gates L1,0-LM,N can be sized so that gates on each $(i+1)^{th}$ row of the array provide twice the capacitance as gates on the $i^{th}$ row of the array. Using non-uniform gates increases the delay circuit's delay range and resolution.

In the programmable delay circuits of FIGS. 18-20, the capacitance at the outputs of multiplexer 200 and every buffer B1-BN is the same at any given time, and when the DELAY data value changes, the capacitance at the multiplexer buffer outputs change by the same amount. The resulting change in D-to-JITTER signal delay is therefore every distributed over the entire length of delay circuit 44 so that none of the outputs of multiplexer 42 or buffers B1-BN, including the JITTER signal, exhibit a large abrupt phase change in response to a change in DELAY data. Distributing the change in signal delay allows changes in delay DATA value to be asynchronous with input signal D without causing large glitches in the JITTER signal.

Figure 21:
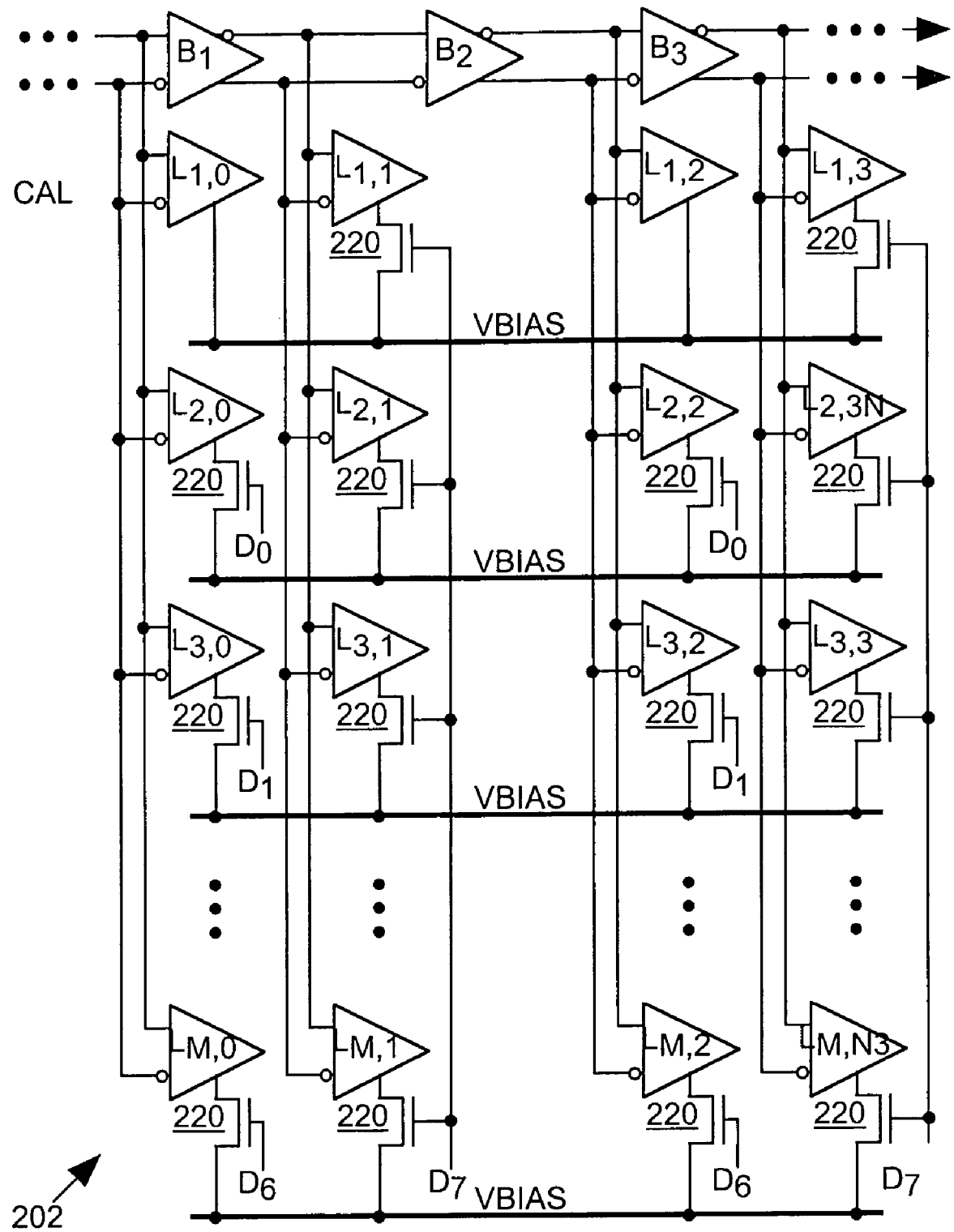

In alternative embodiments of the invention, the jitter generator may provide other relationships between the DELAY data value and capacitance at the output of multiplexer 200 and buffers B1-BN. For example, for very high-resolution delay control, the DELAY data may independently control the capacitance at each buffer output. FIG. 21 illustrates an example implementation of programmable delay circuit 202 similar to that of FIG. 19 except that for an 8-bit input DELAY word having bits {D0, D1 ... D7}, 1. Each gate L1,y, wherein y is even, is hard-wired to VBIAS,
2. Each gate $L_{x,y}$, wherein 1<x<7 and y is even, is connected to VBIAS though a gate 220 controlled by DELAY data bit $D_{x-2}$, and
3. Each gate $L_{x,y}$, wherein y is odd, is connected to VBIAS through a gate 220 controlled by DELAY data bit D7.

In the example of FIG. 21, when the input capacitance of each gate $L_{x,y}$ is 2y times a unit capacitance when connected to VBIAS, the 8-bit DELAY data can set delay circuit 44 to any of 256 different delays. When each gate Lx,y has the same input capacitance when connected to VBIAS, the 8-bit DELAY data can set delay circuit 44 to any of 9 different delays.

Jitter Generation and Calibration

Due to process variations in an IC implementing jitter generator 46, host computer 28 will not be able to precisely predict the path delay through delay circuit 202 for each possible value of DELAY word. However host computer 28 can use measurement circuit 48 to measure the period between successive edges of the JITTER signal output of jitter generator 46 when pattern generator 204 is programmed to produce a repetitive DELAY word sequence. This enables host computer 28 to determine whether the DELAY word sequence causes jitter generator 46 to produce the proper jitter pattern in the JITTER signal. Host computer 28 can adjust values of selected words of the DELAY word sequence as necessary to obtain the desired jitter pattern.

Integration

Figure 1:
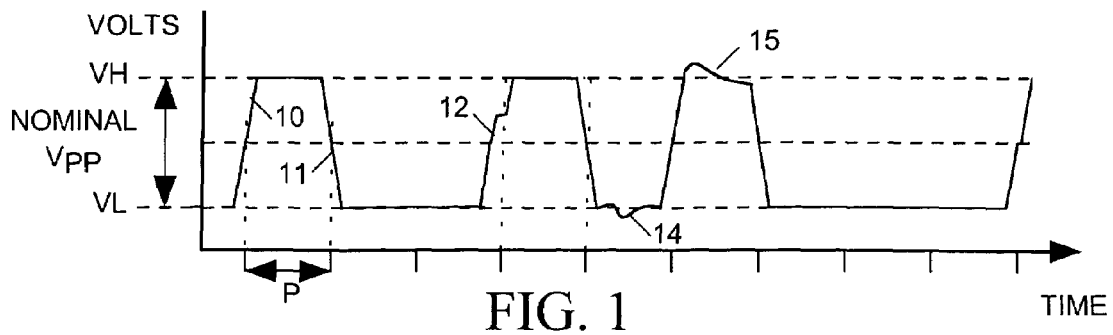
FIG. 1 depicts the voltage of a conventional serial data signal as a function of time.
Figure 2:
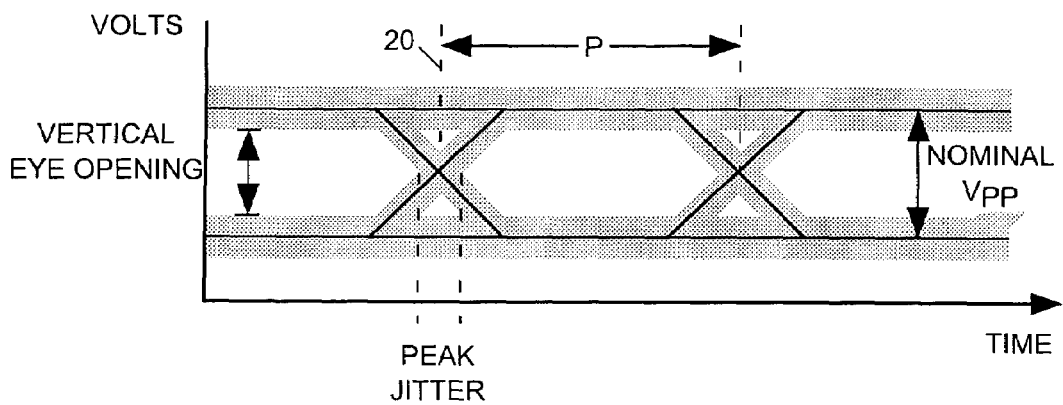
FIG. 2 is a conventional "eye-diagram" generated by a storage oscilloscope repeatedly sweeping a digital signal so that traces of a large number of the signal's data cycles are superimposed on the display.

Referring to FIGS. 1 and 4, in high frequency applications, noise in the signal paths between DUT 24, receiver circuit 33, transmitter circuit 34, measurement jitter generator 46 and measurement circuit 48 can adversely influence measurement and calibration processes. To keep the signal paths short and less subject to noise, it is therefore helpful to incorporate receiver circuit 33, transmitter circuit 34, and measurement circuit 48 into the same integrated circuit 47. The communications between FPGA 50 and serial interface 49 generally occur before and after the test and the signal paths are not as noise sensitive. Thus the data processing functions carried out by FPGA 50 need not be incorporated into IC 47.

The foregoing specification and the drawings depict exemplary embodiments of the best mode(s) of practicing the invention, and elements or steps of the depicted best mode(s) exemplify the elements or steps of the invention as recited in the appended claims. However, the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. An apparatus for testing an electronic device under test the apparatus comprising:
   an integrated circuit for communicating via a plurality of digital signals having edges, including at least one digital integrated circuit output signal having a selectable amount of jitter controlled by the integrated circuit,
   for measuring intervals between two signal edges selected from among edges of the plurality of digital signals, and for selecting one digital signal from among the plurality of digital signals, and generating digital data indicating whether the one digital signal is higher or lower than a selected reference voltage at selected times,
   wherein the integrated circuit can alternatively select the two edges from among the plurality of digital signals as two different edges of the same or differing ones of the plurality of digital signals.

2. The apparatus in accordance with claim 1 wherein data supplied as input to the integrated circuit selects the following:
   the amount of jitter in the digital integrated circuit output signal,
   the two edges selected from among the plurality of digital signals,
   the one digital signal selected from among the plurality of digital signals,
   the selected reference voltage, and
   the selected times at which the digital data indicates whether the one digital signal is higher or lower than the reference voltage.

3. The apparatus in accordance with claim 2 further comprising
   a source of a clock signal having edges:
   a data processing circuit for generating a digital test signal having edges occurring at times relative to the clock signal edges selected by programming data, wherein the integrated circuit variably delays the digital test signal to produce the digital integrated circuit output signal.

4. The apparatus in accordance with claim 3 wherein the integrated circuit comprises:
   a plurality of buffers connected in cascade, each having an output, for delaying the digital test signal;
   a plurality of capacitive circuit elements, each corresponding to a separate one of the buffers and each providing an adjustable capacitance at the output of its corresponding buffer; and
   a control circuit for responding to the clock signal edges by adjusting the adjustable capacitance provided by each of the plurality of capacitive elements in a manner determined by the programming data.

5. The apparatus in accordance with claim 4 wherein the control circuit independently adjusts the adjustable capacitance of each capacitive circuit element.

6. The apparatus in accordance with claim 4 wherein each capacitive circuit element comprises:
   a plurality of capacitors, and
   a plurality of switches controlled by the programming data for coupling selected ones of the capacitors to the output of the buffer corresponding to the capacitive circuit element.

7. The apparatus in accordance with claim 6 wherein each capacitor is provided by an input of a gate having capacitive input impedance.

8. The apparatus in accordance with claim 4 wherein each capacitive circuit element comprises:
   a plurality of gates having inputs linked to the output of the buffer corresponding to the capacitive circuit element, wherein an input capacitance of each gate is a function of a voltage applied to the gate, wherein the control circuit controls a magnitude of the voltage applied to each gate.

9. The apparatus in accordance with claim 1 wherein the device under test generates a device under test output signal in response to the digital integrated circuit output signal, the apparatus further comprising at least one signal path connected between the device under test and the integrated circuit for conveying the digital integrated circuit output signal to the device under test, and for conveying the device under test output signal to the Integrated circuit, as one of the plurality of digital signals.

10. The apparatus in accordance with claim 1, wherein integrated circuit comprises:
    a trigger circuit or generating a trigger signal edge during each of a plurality of repetitions of a digital signal pattern in a selected one of the digital signals, the trigger circuit generating each trigger signal edge on occurrence of a selected edge of the digital signal pattern, and
    a time measurement unit for responding to each trigger signal edge generated by the trigger circuit by measuring an interval between two edges of the plurality of digital signals.

11. The apparatus in accordance with claim 10 wherein the integrated circuit further comprises:
    a comparator for comparing a voltage of the one digital signal to the selected reference voltage, and generating comparison signal indicating whether the one digital signal voltage is higher or lower than the reference voltage, and
    a digitizer for responding to an edge generated by the trigger circuit by repetitively sampling the comparison signal to determine its state.

12. The apparatus in accordance with claim 11 wherein the digitizer comprises:
    a triggered oscillator for generating a periodic clock signal when triggered;
    a synchronizing circuit for responding to each trigger signal edge by triggering the triggered oscillator following a next edge of the digital signal pattern; and
    a circuit for sampling the comparison signal in response to successive edges of the clock signal to produce a data sequence representing successive states of the comparison signal.

13. The apparatus in accordance with claim 10 wherein the trigger circuit comprises:

a first circuit for generating a first number sequence, wherein each number of the first number sequence corresponds to and is generated in response to a different edge of the digital signal pattern;

a second circuit for generating a second number sequence, wherein each number of the second number sequence corresponds to a different edge of the digital signal pattern and is generated following an occurrence of the trigger signal edge, and a third circuit for generating the trigger signal edges in response to comparisons of concurrently generated numbers of the first and second number sequences.

14. The apparatus in accordance with claim 10, wherein trigger circuit generates the trigger signal edge in response to the same selected edge of the digital signal pattern during each of the plurality of repetitions of the digital signal pattern.

15. The apparatus in accordance with claim 10, wherein trigger circuit generates the trigger signal edge in response to a different edge of the digital signal pattern during each of the plurality of repetitions of the digital signal pattern.

16. The apparatus in accordance with claim 10, wherein trigger circuit generates the trigger signal edge at least once in response to every rising edge or every falling edge of the digital signal pattern during said plurality of repetitions of the digital signal pattern.

17. The apparatus in accordance with claim 10 wherein the integrated circuit further comprises
 a first triggered oscillator for generating a first periodic clock signal when triggered;
 a second triggered oscillator for generating a second periodic clock signal when triggered, the first and second periodic clock signals having differing periods;
 a trigger logic circuit for responding to each trigger signal edge by triggering the first triggered oscillator in response to a first edge of the digital signal pattern and by triggering the second triggered oscillator in response to a second edge of the digital signal pattern;
 a first counter for generating a first count of periods of the first periodic clock signal, and for terminating the count in response to a control signal; and
 a coincidence detector for generating the control signal when edges of the first and second periodic clock signals coincide.

18. The apparatus in accordance with claim 17 wherein the integrated circuit further comprises:
 a second counter for generating a second count of periods of the second periodic clock signal and for terminating the second count in response to the control signal.

19. The apparatus in accordance with claim 18 further comprising
 a circuit for processing a plurality of values of the first count generated in response to successive trigger signal edges to determine minimum and maximum values of the first count within each of a plurality of separate value ranges.

20. The apparatus in accordance with claim 18 further comprising:
 a circuit for processing a plurality of values of the first and second counts to generate a data sequence, and for generating data representing a histogram of values of the data sequence.

* * * * *